(12) United States Patent
Momose et al.

(10) Patent No.: US 6,929,990 B2
(45) Date of Patent: Aug. 16, 2005

(54) MOSFET WITH A THIN GATE INSULATING FILM

(75) Inventors: Hisayo Momose, Tokyo (JP); Hiroshi Iwai, Kawasaki (JP); Masanobu Saito, Ciba (JP); Tatsuya Ohguro, Yokohama (JP); Mizuki Ono, Yokohama (JP); Takashi Yoshitomi, Kamakura (JP); Shinichi Nakamura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/681,318

(22) Filed: Oct. 9, 2003

(65) Prior Publication Data

US 2004/0070024 A1 Apr. 15, 2004

Related U.S. Application Data

(63) Continuation of application No. 10/160,036, filed on Jun. 4, 2002, now Pat. No. 6,642,560, which is a continuation of application No. 09/828,205, filed on Apr. 9, 2001, now Pat. No. 6,410,952, which is a continuation of application No. 09/440,938, filed on Nov. 6, 1999, now Pat. No. 6,229,164, which is a continuation of application No. 08/527,562, filed on Sep. 13, 1995, now Pat. No. 5,990,516.

(30) Foreign Application Priority Data

| Sep. 13, 1994 | (JP) | 6-218939 |
| Dec. 6, 1994 | (JP) | 6-302342 |
| Dec. 7, 1994 | (JP) | 6-303900 |
| Jul. 12, 1995 | (JP) | 7-216827 |
| Sep. 11, 1995 | (JP) | 7-258132 |

(51) Int. Cl.$^7$ ............................................. H01L 21/336
(52) U.S. Cl. ...................... 438/197; 438/585; 438/770; 438/787
(58) Field of Search ................................ 438/197, 585, 438/770, 787, 287, 591, 763, 774, 786, 910

(56) References Cited

U.S. PATENT DOCUMENTS

| 4,814,851 A | | 3/1989 | Abrokwah et al. |
| 5,294,571 A | * | 3/1994 | Fujishiro et al. ............ 438/770 |

(Continued)

FOREIGN PATENT DOCUMENTS

| EP | 196 155 | 10/1986 |
| GB | 2172746 | 9/1986 |

(Continued)

OTHER PUBLICATIONS

Momose et al., "Tunneling Gate Oxide Approach to Ultra–High Current Drive in Small–Geometry MOSFETS", 1994 International Electron Devices Meeting, pp. 593–596.

(Continued)

*Primary Examiner*—Minh-Loan Tran
(74) *Attorney, Agent, or Firm*—Foley & Lardner LLP

(57) ABSTRACT

A semiconductor device comprises: a p-type semiconductor substrate (1); an insulating film (3); a gate electrode (2) formed on the substrate via the insulating film; and an n-type source/drain region (5) formed on both sides of a channel forming region (4) located under the gate electrode (2) formed on the substrate (1). In particular, the thickness ($T_{OX}$) of the insulating film (3) is determined to be less than 2.5 nm at conversion rate of silicon oxide film (silicon oxide equivalent thickness); a gate length ($L_g$) of the gate electrode (2) is determined to be equal to or less than 0.3 μm; and further a voltage applied to the gate electrode (2) and the drain region (6) is determined to be 1.5 V or less. Therefore, in the MOSFET having the tunneling gate oxide film (3), the reliability of the transistor under the hot carrier stress can be improved, and the gate leakage current can be reduced markedly, so that the transistor characteristics can be improved markedly.

16 Claims, 24 Drawing Sheets

U.S. PATENT DOCUMENTS

| | | | |
|---|---|---|---|
| 5,412,527 A | | 5/1995 | Husher |
| 5,436,481 A | | 7/1995 | Egawa et al. |
| 5,463,234 A | | 10/1995 | Toriumi et al. |
| 5,464,792 A | * | 11/1995 | Tseng et al. ................. 438/585 |
| 5,489,542 A | * | 2/1996 | Iwai et al. .................. 438/287 |
| 5,508,543 A | | 4/1996 | Hartstein et al. |
| 6,229,164 B1 | | 5/2001 | Momose et al. |
| 6,410,952 B2 | | 6/2002 | Momose et al. |

FOREIGN PATENT DOCUMENTS

| | | |
|---|---|---|
| JP | 57-118673 | 7/1982 |
| JP | 01-170044 | 7/1989 |
| JP | 02-273934 | 11/1990 |
| JP | 04-091478 | 3/1992 |
| JP | 5/275690 | 10/1993 |
| JP | 05-275690 | 10/1993 |
| JP | 05-315608 | 11/1993 |

OTHER PUBLICATIONS

Fiegna et al., A New Scaling Methodology for the 0.1–0.025 $\mu$m MOSFET, 1993 Symposium on VLSI Technology, pp. 33–34.

Ono et al., Sub–50 nm Gate Length N–MOSFETS with 10 nm Phosphorus Source and Drain Junctions, 1993 International Electron Devices Meeting, pp. 119–122.

M. Saito et al., "An SPDD p–MOSFET Structure Suitable for 0.1 and Sub 0.1 Micron Channel Length and its Electrical Characteristics," 1992 International Electron Devices Meeting Technical Digest, pp. 897–900.

\* cited by examiner

CONCENTRATION PROFILE TO
DIFFUSION DEPTH AT SOURCE/DRAIN REGION

DEPENDANCE OF TUNNELING GATE CURRENT Ig UPON GATE LENGTH Lg

DEPENDANCE OF TRANSCONDUCTANCE gm UPON GATE LENGTH Lg

DEPENDANCE OF CURRENT Ig
AND Id UPON SUPPLY VOLTAGE Vd = Vg

DEPENDANCE OF TRANSCONDUCTANCE gm UPON GATE VOLTAGE

DEPENDANCE OF TRANSCONDUCTANCE gm UPON GATE VOLTAGE

DEPENDANCE OF TRANSCONDUCTANCE gm UPON GATE VOLTAGE

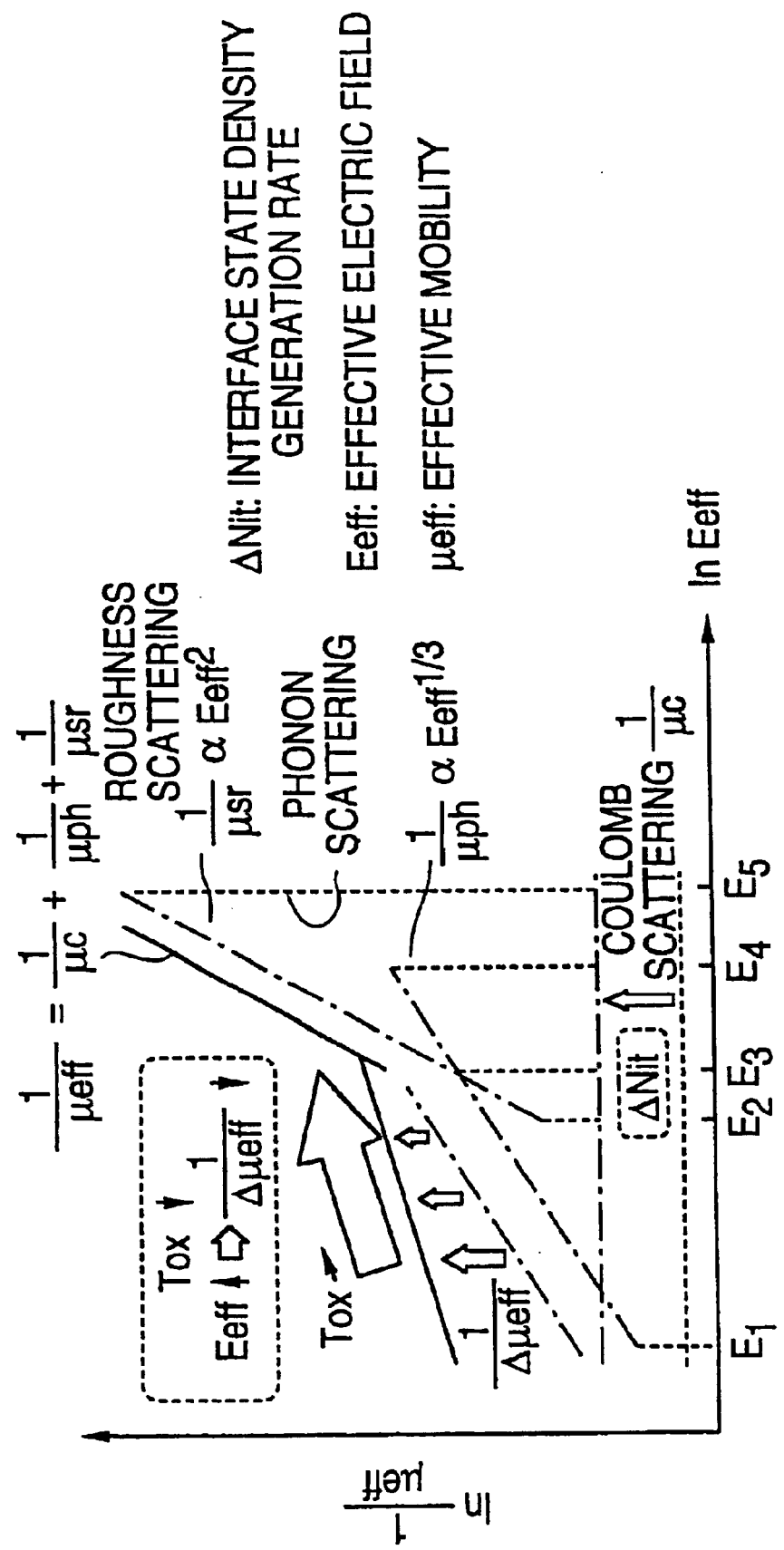

MOSFET WITH A THIN GATE INSULATING FILM

CORRESPONDING RELATED APPLICATIONS

This application is a continuation of application Ser. No. 10/160,036 filed Jun. 4, 2002 U.S. Pat. No. 6,642,560, which is a continuation of application Ser. No. 09/828,205 filed on Apr. 9, 2001 U.S. Pat. No. 6,410,952; which is a continuation of Ser. No. 09/440,938 filed Nov. 6, 1999 U.S. Pat. No. 6,229,164; which in turn is a continuation of Ser. No. 08/527,562 filed Sep. 13, 1995 U.S. Pat. No. 5,990,516.

BACKGROUND OF THE INVENTION

1. Field of the Invention

The present invention relates to a semiconductor device, and more particularly to a ultra-high current drive MOS transistor suitable for use under a low supply voltage.

2. Description of the Prior Art

In the field of the MOS transistors, with the advance of the integration technique of the MOSFETs in particular, the device having a gate length within a range equal to or less than 0.5 µm has been studied and developed at various places. In 1974, R. L. Dennard et al. have proposed the so-called scaling method for the MOSFET down-scaling. This method indicates that when the size of one composing element (e.g., channel length) of an element is required to be reduced, the operating characteristics of the transistor can be secured, as far as the other composing elements are reduced at the same reduction ratio. Basically, from the 1979s to the early 1990s, the higher integration technique of the MOS-FETs has been realized on the basis of this scaling method.

With the advance of the higher and higher integration, however, various composing elements approach the respective limit values referred to as "limit values" so that it has become difficult to further reduce the various composing elements beyond these limit values. For instance, since the limit of the thickness of the gate insulating film is generally considered as about 3 to 4 nm, when the film thickness is reduced below this value, direct tunneling current between the gate electrode and the source/drain electrode increases, so that it has been well known that the transistor cannot operate normally.

To overcome this problem, in 1993, Fiegna et al. have proposed such a technique that although the gate insulating film thickness is fixed to about 3 nm, the composing elements other than the gate insulating film can be reduced as reported by Document (Writer): C. Fiegna. H. Iwai, T. Wade, T. Saito, E. Sangiorgio, and B. Ricco; (Title) a new scaling methodology for the 0.1 to 0.021 um MOSFET, 'Dig. of Tech. Papers, VLSI Symp; (Source) Technol., Kyoto, pp. 33–34, 1993). On the basis of this technique, in the same year, Ono et al. have realized a translator having a gate length of 0.04 um, [as reported by Document (Writer): M. Ono, M. Saito, T. Yoshitomi, C. Fiegna, and H. Iwai; (Title) Sub-50 nm gate length n-MOSFETs with 10 nm phosphorus source and drain junction: (Source) IEDM Tech. Dig., pp. 119 to 122, 1993).

The transistor having a gate insulating film thickness of 3 nm and a gate length of 0.04 nm was manufactured as follows: First, after an isolation region had been formed on a p-type silicon substrate in accordance with LOCOS (Local Oxidation of Silicon), p-type impurities (e.g., B (boron)) were introduced into the channel forming region to such an extent that any required threshold voltage was obtained.

After that, as the gate oxide film, an oxide film of about 3 nm was formed on the surface of the silicon substrate by oxidization at 800° C. for 10 min within a dry $O_2$ atmosphere, for instance. Further, after poly silicon containing P (phosphorous) was deposited to a thickness of about 100 nm, a resist was applied, and the applied resist was patterned to obtain a gate electrode of a desired length. Further, n-type impurities were introduced into the source/drain forming region, by solid phase phosphorus diffusion from a PSG film (a silicon oxide film containing P (phosphorus)) remaining on the gate electrode side wall portion. After that, in order to improve the connection to the metal wiring portion and further to reduce the resistance of the diffusion layer portion (which exerts no influence upon the short channel effect of the transistor), n-type impurities (a dose: $5\times10^{15}$ cm$^{-2}$) were introduced in accordance with the ion implantation method, for instance. At this time, the substrate was annealed at 1000° C. for 10 min, for instance for impurity diffusion and activation. After that, contact portions were opened, and metallization was formed.

In the transistor manufacture as described above, the sheet resistance (ρs) of the source/drain diffusion layer under the gate side wall portion was 6.2 kΩ/□, and the diffusion length (i.e., the depth of the source/drain region) was 10 nm, as a result of SIMS analysis.

In the above-mentioned prior art transistor, however, since the parasitic resistance increased relatively large due to the shallow source/drain region, it was impossible to obtain a high current drive capability corresponding to the reduction of the gate length.

SUMMARY OF THE INVENTION

With these problems in mind, therefore, it is the object of the present invention to provide a MOS type semiconductor device of high current drive capability.

According to the first aspect of the present invention, there is provided a semiconductor device, comprising:

a first-conductivity type semiconductor substrate;

an insulating film formed an said semiconductor substrate;

a gate electrode formed on said semiconductor substrate via said insulating film; and a second-conductivity type source/drain region formed on both sides of a channel forming region located under said gate electrode formed on said semiconductor substrate via said insulating film; and wherein a thickness of said insulating film is less than 2.5 nm at silicon oxide equivalent thickness; and a gate length of said gate electrode is equal to or less than 0.3 µm.

According to the present invention, when the thickness of the gate insulating film is determined less than 2.5 nm, it is possible to improve the reliability of the device under the hot carrier stress as shown in FIG. 3. In addition, when the thickness of the gate insulating film is reduced 2 nm or less, the reliability can be further improved.

Further, as shown in FIG. 4, when the channel length is determined equal to or less than 0.3 µm, the gate current can be reduced markedly, so that the transistor characteristics can be improved markedly.

Consequently, in the semiconductor device according to the present invention, when the gate length is determined equal to or less than 0.3 µm and the gate insulating film thickness is determined less than 2.5 nm, a transistor of excellent operating characteristics and high hot carrier reliability can be realized.

According to the second aspect of the present invention, there is provided a semiconductor device, comprising:

a first-conductivity type semiconductor substrate;

an insulating film formed on said semiconductor substrate;

a gate electrode formed an said semiconductor substrate via said insulating film; and a second-conductivity type source/drain region formed on both sides of a channel forming region located under said gate electrode formed on said semiconductor substrate via said insulating film; and wherein a thickness of said insulating film is less than 2.5 nm at silicon oxide equivalent thickness; a gate length of said game electrode is equal to or less than 0.3 μm; and a voltage applied to said gate electrode and said drain region is determined to be 1.5 V or less.

According to the third aspect of the present invention, there is provided a semiconductor device, comprising:

a first-conductivity type semiconductor substrate;

an insulating film formed on said semiconductor substrate;

a gate electrode formed on said semiconductor substrate via said insulating film; and a second-conductivity type source/drain region formed on both sides of a channel forming region located under said gate electrode formed on said semiconductor substrate via said insulating film; and wherein a transconductance (gm) is as follows:

$$gm>400\ V_{DD}+140\ \text{in nMOS}$$

$$gm>260\ V_{DD}+10\ \text{in pMOS}$$

where a unit of $V_{DD}$ is V and a unit of gm is mS/mm.

According to the fourth aspect of the present invention, there is provided a semiconductor device, comprising:

a MOSFET including:

a first-conductivity type semiconductor substrate;

an insulating film formed on said semiconductor substrate and having a thickness less than 2.5 nm at silicon oxide equivalent thickness film;

a gate electrode formed on said semiconductor substrate via said insulating film; and a second-conductivity type source/drain region formed on both sides of a channel forming region located under said gate electrode formed on said semiconductor substrate via said insulating film; and a Schottky diode formed of a metal/silicon layer having a breakdown voltage lower than that of said insulating film and connected to said gate electrode of said MOSFET.

BRIEF DESCRIPTION OF THE DRAWINGS

FIG. 16 is a graphical representation showing the dependance of the carrier effective mobility upon the effective electric field;

DETAILED DESCRIPTION OF THE PREFERRED EMBODIMENTS

Figure 1:
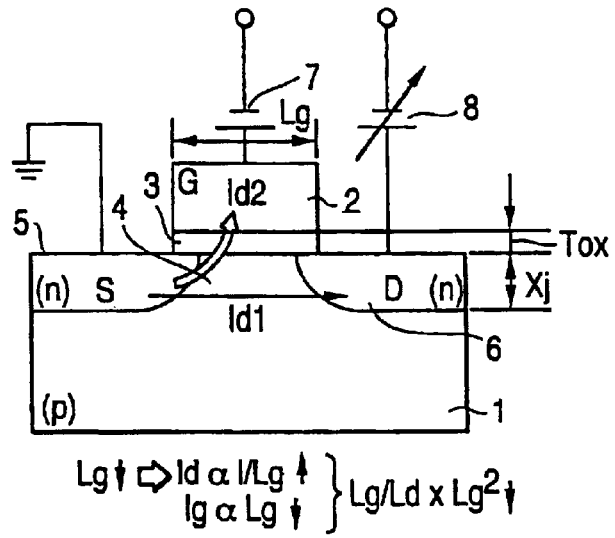
FIG. 1 is a cross-sectional view showing a structure of an embodiment of the MOS type transistor according to the present invention.

Embodiments of the present invention will be described hereinbelow with reference to the attached drawings. FIG. 1A shows a structure of the MOS type transistor according to the present invention. In FIG. 1A, on a first-conductivity type (e.g., p-type) semiconductor substrate 1, a gate electrode 2 is formed by interposing an oxide film 3 between the two. On both sides of a channel forming region 4 formed under the gate electrode 2 of the substrate 1, a second-conductivity type (e.g., n-type) (opposite to the first-conductivity type) high concentration diffusion layer is formed as a source region 5 and a drain region 6, respectively. In use, a supply voltage 7 is applied to the gate electrode 2 and the drain region 6. The gate length $L_g$ (the dimension of the gate electrode 2 in the direction of the carrier moving in channel region 4) is determined equal to or leas than 0.3 μm, and the thickness $T_{OX}$ of the gate insulating film 3 is determined less than 2.5 nm. In the transistor of the present invention having the above-mentioned gate length $L_g$, it is possible to increase the transconductance gm and to decrease the tunneling current $I_{d2}$ flowing to the gate 2 (in the current ($I_{d1}+I_{d2}$) to be passed from the source region 5 to the drain region 6) at the same time.

In the typical dimensions of the respective parts of the transistor of the present invention shown in FIG. 1, the gate length ($L_g$) of the gate electrode is 0.09 μm; the thickness ($T_{OX}$) of the gate insulating film is 1.5 nm; the effective channel length ($L_{eff}$) between the source and drain 5 and 6 is 0.05 μm; and the diffusion depth ($x_j$) in the vicinity of the channel 4 is 30 nm (which is relatively shallow, in comparison with the other regions). In this embodiment, the diffusion layer in the vicinity of the channel is formed by solid-phase diffusion from a PSG film formed on the gate side wall, which is referred to as a MOS transistor of SPDD (solid phase diffused drain) structure.

The method of manufacturing the major part of the transistor as described above will be described hereinbelow.

After an element region and an element separating region had been both formed on the semiconductor substrate 1 in accordance with the conventional method, the substrate was oxidized at 800° C. for 10 sec by RTO (Rapid Thermal Oxidation) method. Owing to this method, the gate insulating film 3 with a film thickness of about 1.5 nm (which satisfies the above-mentioned condition) was obtained. Further, the gate insulating film 3 with a thickness of 1.8 nm was formed at 850° C. for 10 sec. Further, the gate insulating film 3 with a thickness of 2.0 nm was formed at 900° C. for 5 sec. In other words, it was possible to form the gate insulating film 3 with any required film thickness less than 2.5 nm by selecting the heating temperature and the heating time. After that, a polysilicon film containing phosphorus had been deposited about 100 nm, the polysilicon film was patterned by anisotropic etching to form the gate electrode of any desired length $L_g$.

Figure 2:
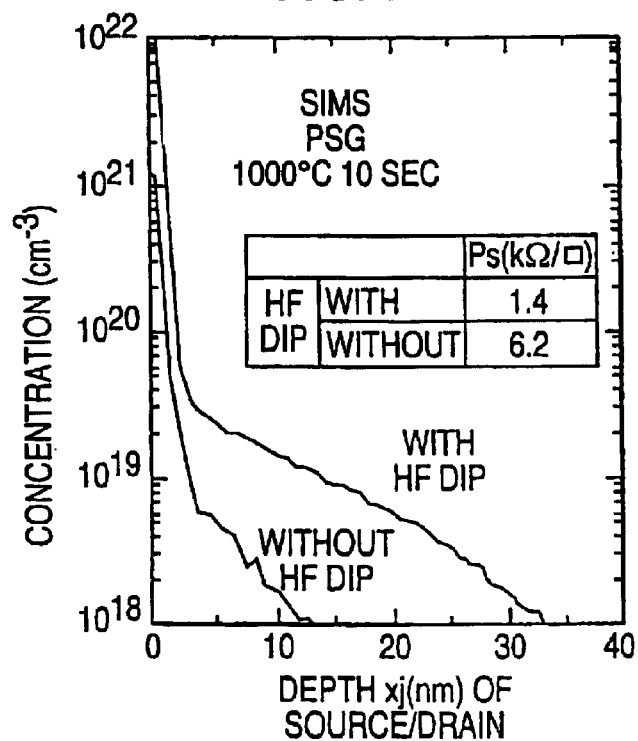
FIG. 2 is a graphical representation showing the impurity concentration profile to a diffusion depth at the source and drain region of the transistor shown in FIG. 1.

After HF processing, the source/drain regions 5 and 6 with a diffusion length of 30 nm were formed by solid-phase diffusion from the PSG film (the silicon oxide film containing phosphorus). FIG. 2 shows the profile of the impurity concentration thereof. The sheet resistance ps of the formed diffusion layer was 1.4 kΩ/□. Further, when the HF processing was not made, the sheet resistance ρs of the formed diffusion layer was 6.2 kΩ/□.

The other process which follows the above-mentioned process is substantially the same as with the case of the conventional method. In the above-mentioned method, the minimum gate length of 0.06 μm was realized. Further, the transistors with gate lengths of any desired dimensions were manufactured. Further, the gate oxide films with any desired thicknesses between 1.5 and 2.5 nm were realized. Further, the gate length and the thickness of the gate insulating film were observed and confirmed by use of a TEM (transmission electron microscope).

Various characteristic evaluation results of the MOSFET formed as described above will be explained hereinbelow.

Figure 3:
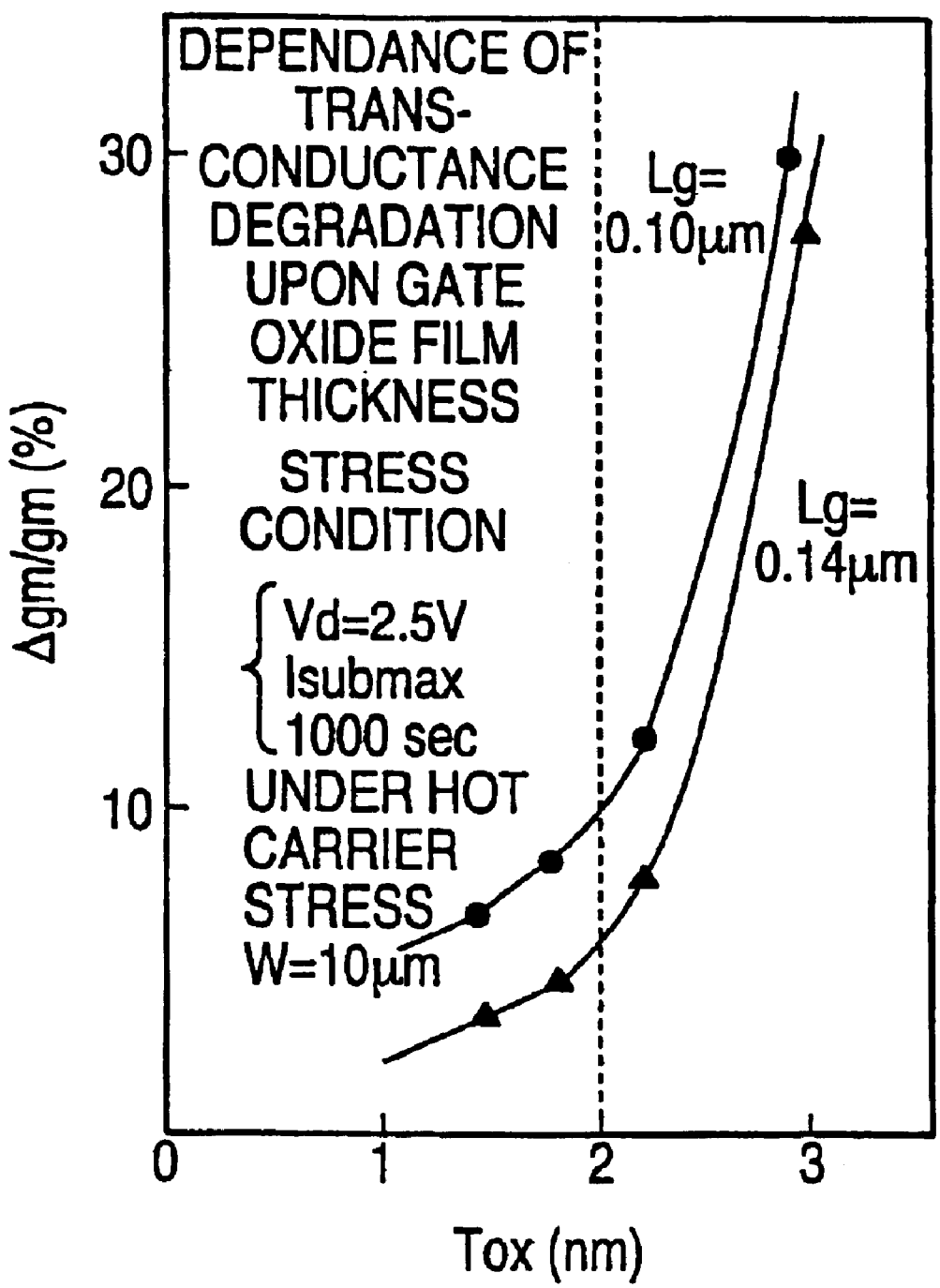
FIG. 3 is a graphical representation showing the dependance of the degradation of the transconductance upon the gate oxide film thickness $T_{OX}$, when the same transistor is under the hot carrier stress ($V_d$=2.5 V; $I_{submax}$, stress application time of 1000 sec)

FIG. 3 shows the dependence of the transconductance (gm) degradation rate (%) upon the gate oxide film thickness ($T_{ox}$) under hot carrier stress (stress condition $V_d$–2.5V; $I_{submax}$) FIG. 3 indicates that when the gate oxide film thickness is less than 2.5 nm, the degradation rate of the transconductance gm can be reduced down to about half of the degradation rate obtained when the gate oxide film thickness is 3 nm (this thickness has been so far considered as a limit value at which tunneling current begins to flow), and thereby the life time of the transistor can be increased two times or more. Therefore, it is desirable that the gate oxide film thickness $T_{ox}$ is determined less than 2.5 nm.

Further, when the thickness of the gate oxide film 3 is determined equal to or less than 2.0 nm, the life time of the transistor can be further increased three times or more. Therefore, when the gate oxide film thickness $T_{OX}$ is determined 2.0 nm, this is further preferable. Further, when the thickness $T_{OX}$ of the gate oxide film 3 is equal to or less than 2 nm, the degradation rate becomes further stable as being less than 10% (if the gate length $L_g$ is 0.01 μm) and as being less than 6% (if the gate length $L_g$ is 0.14 μm). However, when the thickness $T_{OX}$ of the gate oxide film 3 increases more than 2.5 nm, an abrupt degradation of the transconductance gm can be recognized.

Figure 4:
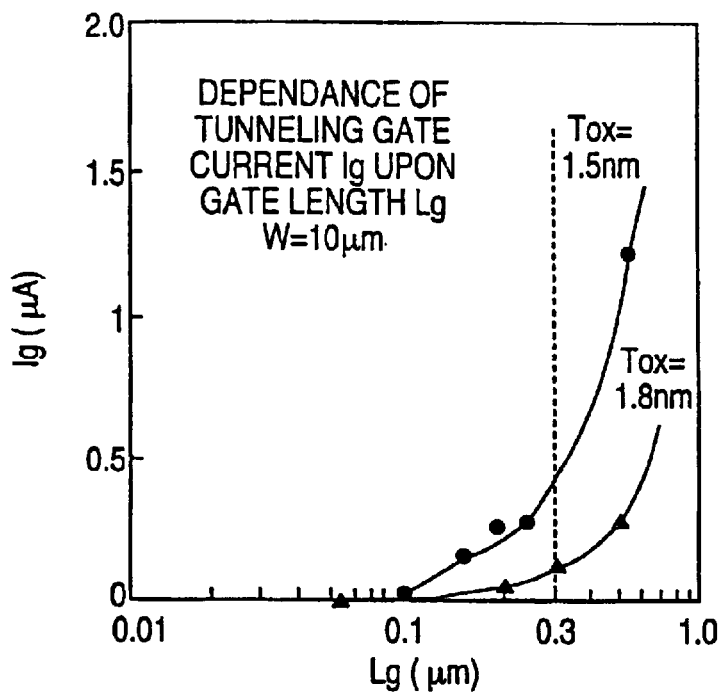
FIG. 4 is a graphical representation showing the dependance of the tunnelling gate current $I_g$ upon the gate length $L_g$ in the same transistor.

FIG. 4 shows the dependance of the tunneling gate current $I_g$ upon the gate length $L_g$. In FIG. 4, when the gate width W is 10 μm and the oxide film thickness $T_{OX}$ is 1.5 nm, if the gate length $L_g$ is equal to or less than 0.3 μm, the tunneling current $I_g$ is stable as being less than 0.5 μA. Further, when the oxide film thickness $T_{OX}$ is 1.8 nm, the tunneling current $I_g$ is also stable as being less than 0.1 μA. In contrast with this, if the gate length $L_g$ exceeds 0.3 μm, an abrupt increase of the gate current $I_g$ can be recognized.

Figure 5:
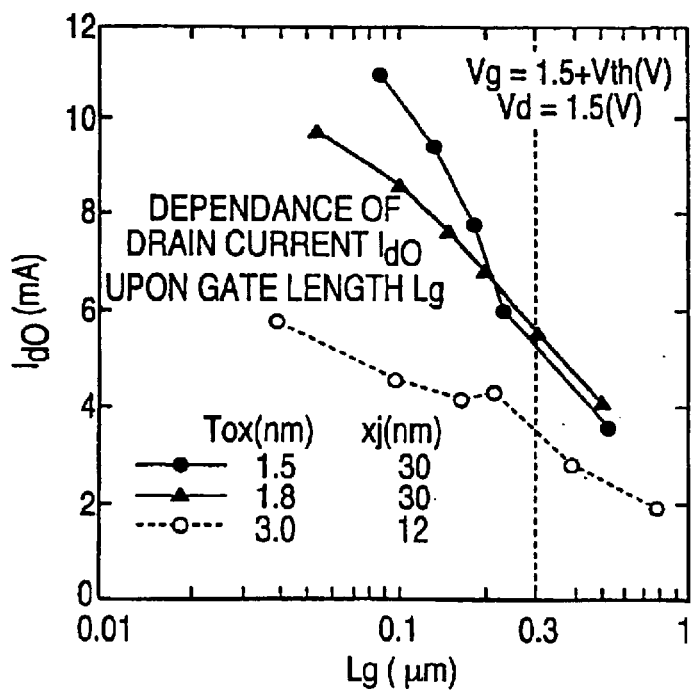
FIG. 5 is a graphical representation showing the dependance of the drain current $I_{d0}$ upon the gate length $L_g$ in the same transistor (W=10 μm)

FIG. 5 shows the dependance of the drain current $I_{d0}$ upon the gate length $L_g$. In this drawing, three cases where the gate oxide film thickness $T_{OX}$ is 1.5 nm and the diffusion length $x_j$ is 30 nm (as a first invention example); $T_{OX}$ is 1.8 nm and $x_j$ is 30 nm (as a second invention example); and $T_{OX}$ is 3.0 nm and $x_j$ is 12 nm (as a prior art example) are shown. FIG. 5 indicates that the drain current driving capability of the invention examples can be improved about twice larger than that of the prior art example.

Figure 6:
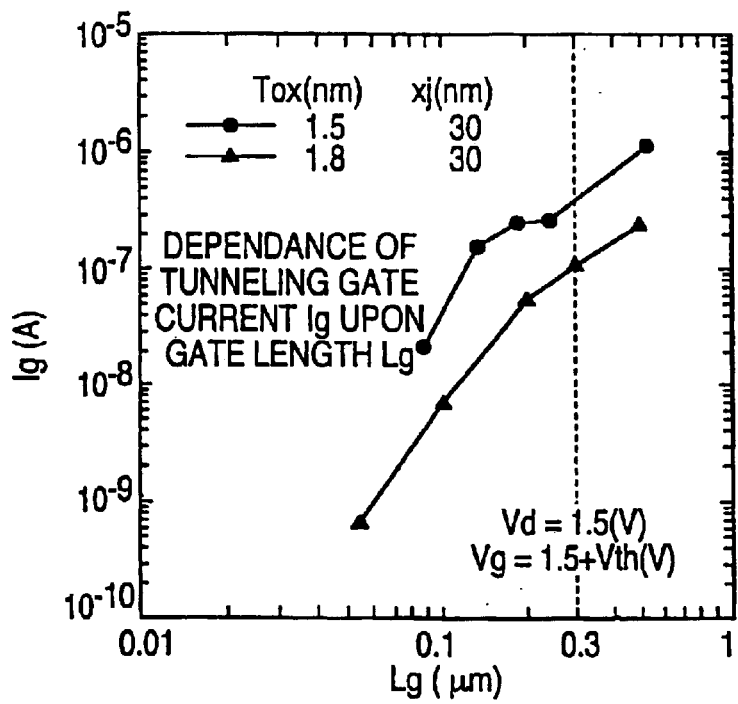
FIG. 6 is a graphical representation showing the dependance of the tunnelling gate current $I_g$ upon the gate length $L_g$ in the same transistor (W=10 μm)
Figure 7:
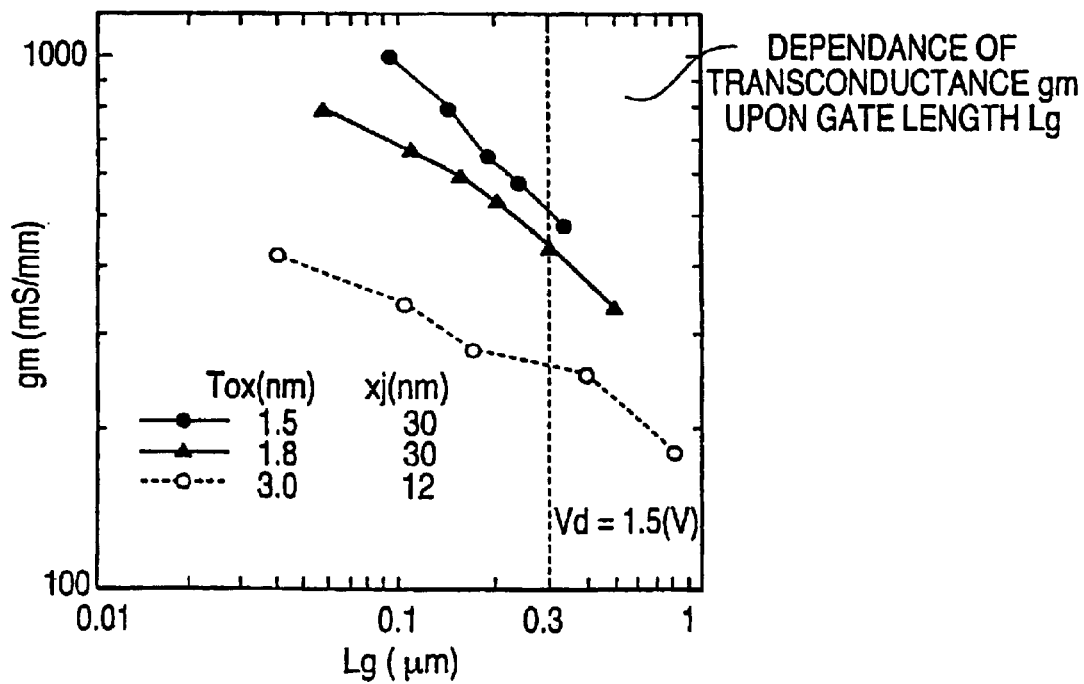
FIG. 7 is a graphical representation showing the dependance of the transconductance gm upon the gate length $L_g$ in the same transistor (W=10 μm)

FIG. 6 shots the dependance of the tunneling gate current $I_g$ upon the gate length $L_g$, and FIG. 7 shows the dependance of the transconductance gm upon the gate length $L_g$. In these drawings, three cases where the gate oxide film thickness $T_{OX}$ is 1.5 nm and the diffusion length $x_j$ is 30 nm (as the first invention example); $T_{OX}$ is 1.8 nm and $x_j$ is 30 nm (as the second invention example); and $T_{OX}$ is 3.0 nm and $x_j$ is 12 nm (as the prior art example) are shown. FIGS. 6 and 7 indicate that the tunneling current drive capability and the transconductance of the invention examples can be improved about 1.5 to 2 times larger than that of the prior art example when the gate length is the same. Further, when the gate length $L_g$ is equal to or less than 0.3 μm, since the tunneling current $I_g$ at this time can be reduced less than ¹⁄₁₀⁴ of the drain current, there exists no specific problem in operation.

Figure 8A:
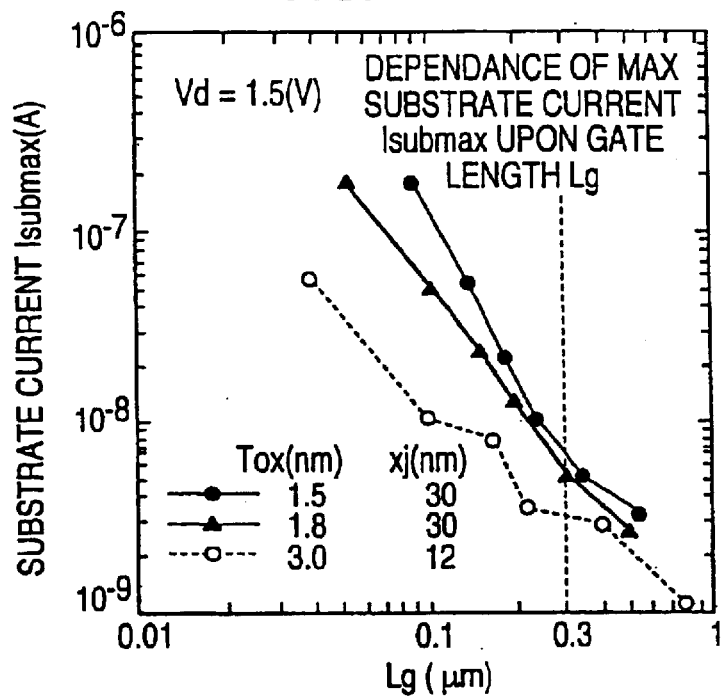
FIG. 8A is a graphical representation showing the dependence of the maximum substrate current $I_{submax}$ upon the gate length $L_g$ in the same transistor (W=10 μm)
Figure 8B:
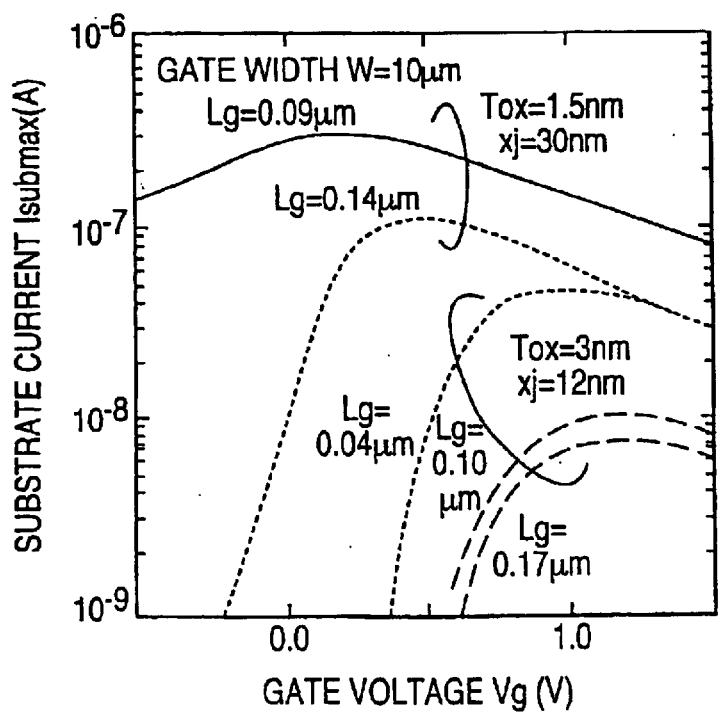
FIG. 8B is a graphical representation showing the dependance of the substrate current $I_{sub}$ upon the gate voltage $V_g$ in the same transistor (W=10 μm)
Figure 9:
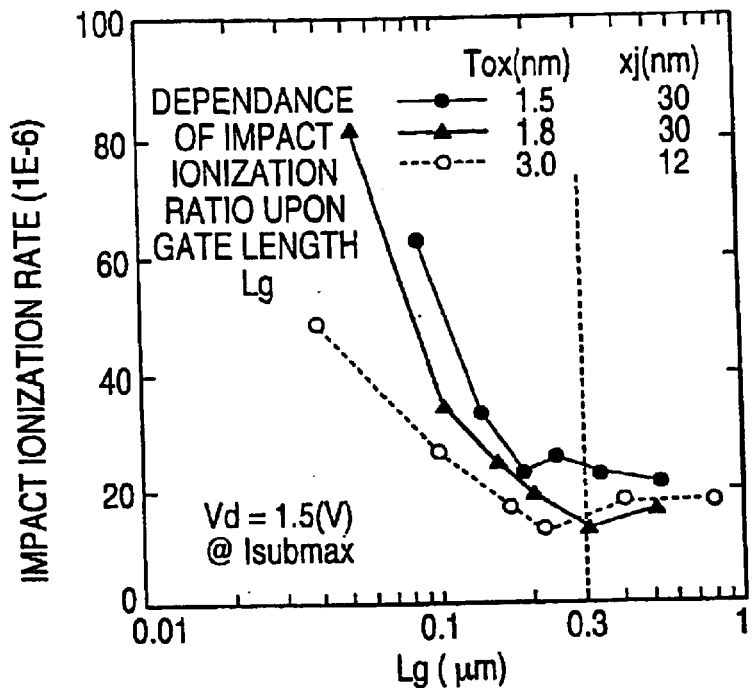
FIG. 9 is a graphical representation showing the dependance of the impact ionization ratio upon the gate length $L_g$ in the same transistor (W=10 μm)

FIGS. 8A and 8B show the dependence of the substrate current $I_{sub}$ upon the gate length $L_g$ and upon the gate voltage $V_g$, and FIG. 9 shows the dependance of the impact ionization ratio of the substrate current upon the gate length $L_g$. These values are indices of the transistor reliability. With respect to the substrate current $I_{sub}$ in particular, FIG. 8B further shows the ($V_g$–$I_{sub}$) characteristics with the gate length $L_g$ as a parameter. In FIG. 8B, three cases where the gate oxide film thickness $T_{OX}$ is 1.5 nm and the diffusion length $x_j$ is 30 nm (as the first invention example); $T_{OX}$ is 1.8 nm and $x_j$ is 30 nm (as the second invention example); and $T_{OX}$ is 3.0 nm and $x_j$ is 12 nm (as the prior art example) are shown. These drawings indicate that the substrate current and the impact ionization ratio of the transistors according to the present invention are larger than those of the prior art transistor.

Figure 17:
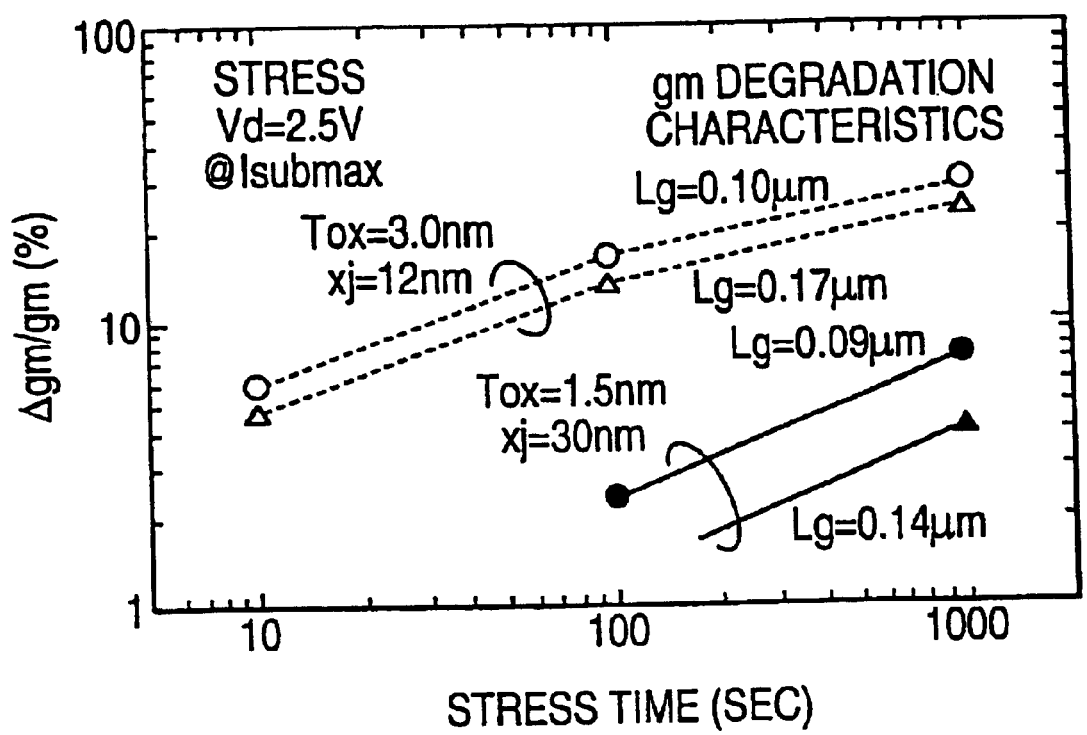
FIG. 17 is a graphical representation showing the characteristics of degradation of the transconductance gm with the lapse of the stress time) of one embodiment of the MOS type transistor according to the present invention.

FIG. 17 shows the degradation characteristics of the transconductance gm (according to the stress time). FIG. 17 shows the test results obtained when two prior art transistors (the oxide film thickness $T_{OX}$ is 3.0 nm; the diffusion length $x_j$ is 12 nm; and gate length $L_g$ is 0.10 μm) and (the oxide film thickness $T_{OX}$ is 3.0 nm; the diffusion length $x_j$ is 12 nm; and gate length $L_g$ is 0.17 μm) and two invention transistors (the oxide film thickness $T_{OX}$ is 1.5 nm; the diffusion length $x_j$ is 30 nm; and gate length $L_g$ is 0.09 μm) and (the oxide film thickness $T_{OX}$ is 1.5 nm; the diffusion length $x_j$ is 30 nm; and gate length $L_g$ is 0.14 μm) are used. The dependance of the transconductance upon stress time is roughly the same in both the prior art transistors and the invention transistors. In the case of the invention transistors, however, since the Δgm/gm itself is low, it has been confirmed that the degradation characteristics gm is can be improved.

FIG. 16 shows the dependance of the carrier effective mobility upon the effective electric field, which is also used as an index of transistor reliability, [as reported by Document (Writer); Y. Toyoshima, H. Iwai, F. Matsuoka, H. Hayashida, K. Maeguchi; (Title) Analysis on gate-oxide thickness dependence of non-carrier induced degradation in thin-gate oxide nMOSFETs; (Source) IEEE Trans, Electron Devices, vol. 37, No. 6, pp 1496 to 1503, 1990)]. Further, as the factors for deciding the carrier effective mobility (1/$\mu_{eff}$), there are the surface roughness scattering (1/$\mu_{sr}$), phonon scattering (1/$\mu_{ph}$) and coulomb scattering (1/$\mu_c$). Therefore, the total movability (1/$\mu_{eff}$) can be expressed as $$\ln(1/\mu_{eff}) = \ln((1/\mu_c)+(1/\mu_{sr})+(1/\mu_{ph}))$$

Further, in the graphs, the dashed lives indicate the carrier effective mobility due to various factors, and the solid line indicates the total carrier effective mobility.

In FIG. 17, the reason why the invention transistors are superior to the prior art transistors in the hot carrier reliability, that is, the reason why the degradation rate ($\Delta$gm/gm) of the invention transistors is smaller than that of the prior art transistors is that an increase in interface state density caused by hot carrier stress, that is, the effect of causing a decrease in the current drive capability due to mobility degradation is not prominent with decreasing thickness of the gate oxide film, as shown in FIG. 16. That is, when the oxide film thickness is thin, since the electric field in the vertical direction of the channel is very strong, the mobility is mainly dominant by the surface roughness, so that the influence of the coulomb scattering due to an increase in the interface state density does not exert an influence upon the mobility.

Therefore, in the case of the MOSFET of thin gate oxide film, it is possible to obtain a transistor of high reliability and less degradation after stress application, in spite of the fact that the substrate current and the impact ionization ratio are both relatively high.

Figure 10:
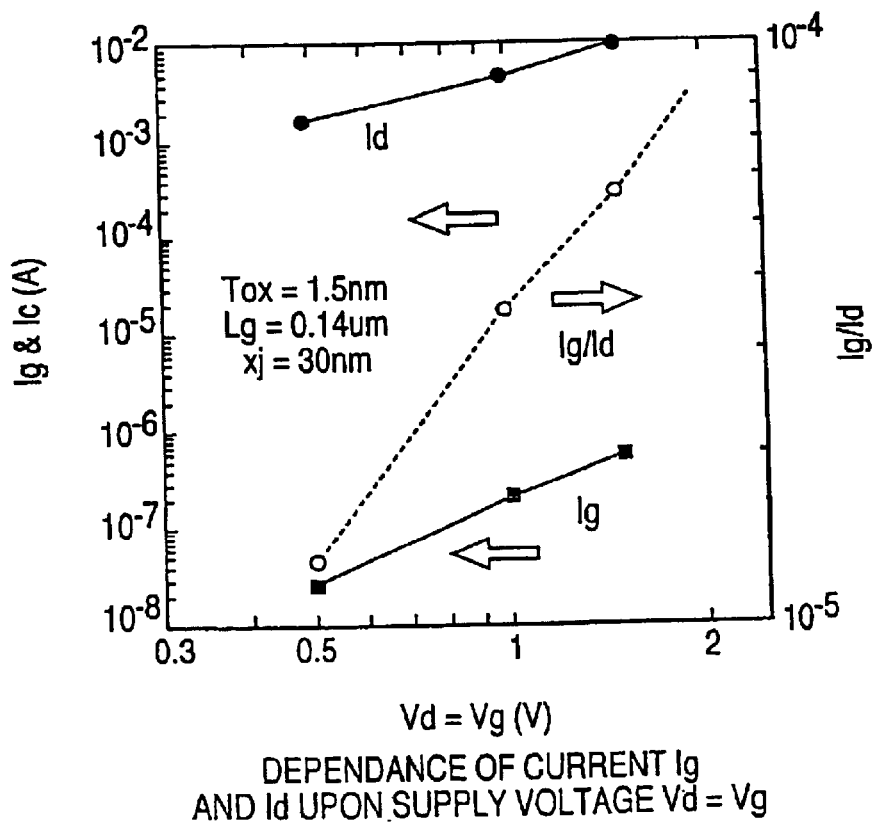
FIG. 10 is a graphical representation showing the dependance of the currents $I_g$ and $I_d$ upon the supply voltage $V_d$=$V_g$ in the same transistor ($L_g$=0.14 μm, W=10 μm)

FIG. 10 shows the dependance of the currents $I_g$ and $I_d$ upon the supply voltage $V_d=V_g$, in which the oxide film thickness $T_{OX}$ is 1.5 nm; the gate length $L_g$ is 0.14 $\mu$m; and the diffusion depth $x_j$ is 30 nm. Further, in the case of the invention transistor, when the supply voltage is equal to or less than 2.0 V, $I_g/I_d$ is equal to or less than $1\times10^{-4}$, so that it is found that there exists no specific problem in operation. Further, when the supply voltage is equal to or less than 1.5 V, $I_g/I_d$ is equal to or less than about $6\times10^{-5}$, so that it is possible to realize a transistor of further higher reliability.

Figure 11:
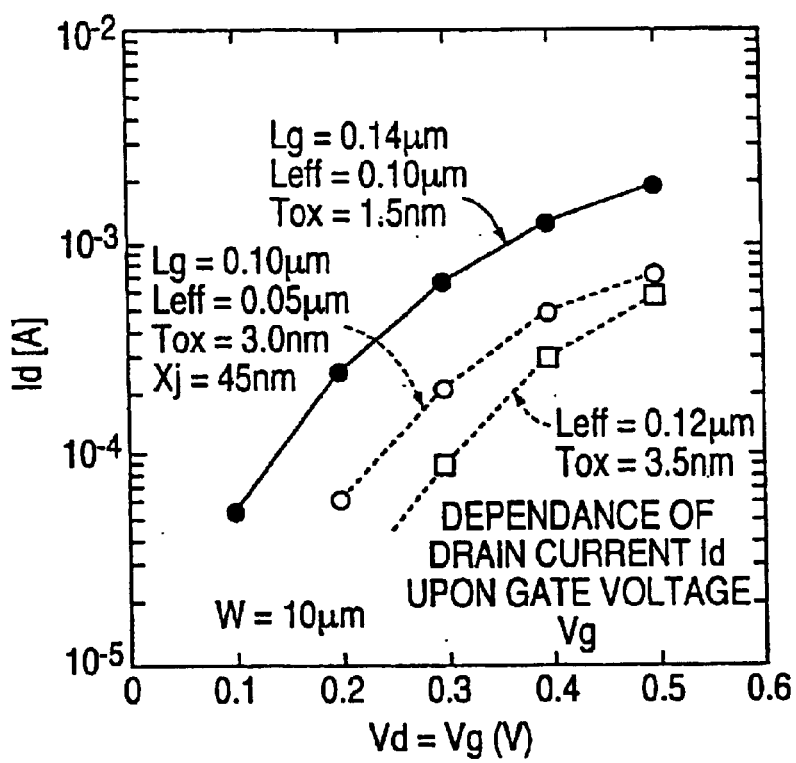
FIG. 11 is a graphical presentation showing the dependance of the drain current $I_d$ upon the supply voltage $V_d$=$V_g$ in the same transistor ($L_g$=0.14 μm, W=10 μm)

FIG. 11 shows the dependence of the drain current $I_d$ upon the gate voltage $V_g$, in which the same transistors having the same characteristics as with the case shown in FIG. 10 are measured. FIG. 11 indicates that in the invention transistors, it is possible to obtain the current drive capability 3 to 5 time higher than that of the results so far reported, even under the lower supply voltage.

Figure 12:
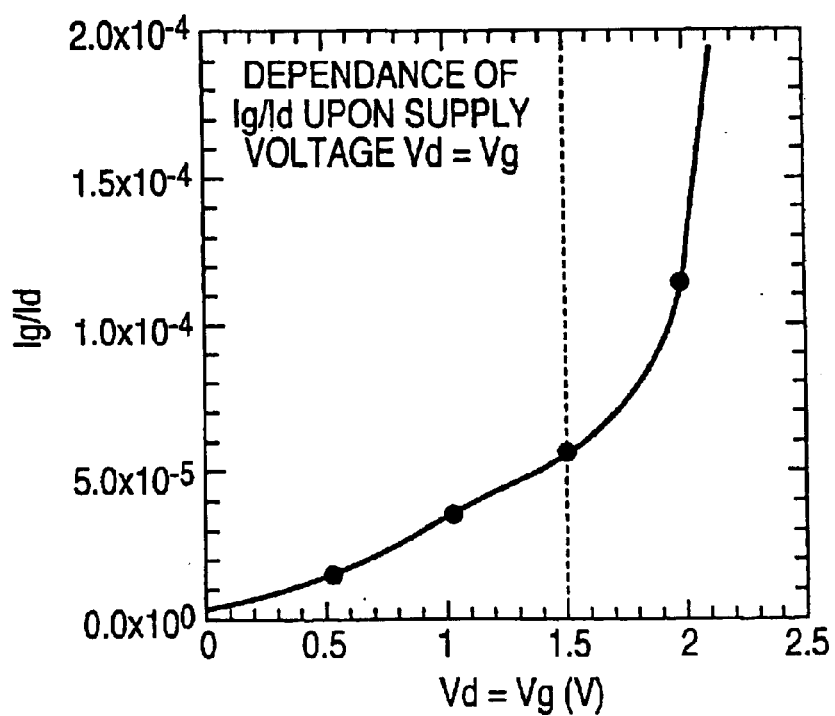
FIG. 12 is a graphical representation showing the dependance of the current ratio $I_g/I_d$ upon the supply voltage $V_d$=$V_g$ in the same transistor.

FIG. 12 shows the dependance of $I_g/I_d$ upon the drain voltage $V_d$. As shown in FIG. 12, an excellent result of $I_g/I_d$ of $6.0\times10^{-5}$ or less can be obtained when the drain voltage $V_d$ is equal to or less than 5 V. In contrast with this, when the drain voltage $V_d$ exceeds 1.5 V, since the tunneling gate current $I_g$ increases abruptly, it can be found that the characteristics deteriorate.

Accordingly, as far as the invention transistor is used for the circuit of the drain voltage of 1.5 V or less, it can be understood that the invention transistor has excellent characteristics.

Further, when the invention transistor is used for a circuit of the drain voltage of 1.2 V or less, since the ratio ($I_g/I_d$) of the tunneling current ($I_g$) to the channel current ($I_d$) can be reduced about 25% at the supply voltage of 1.5 V, the performance of the transistor can be improved markedly. In FIG. 12, the value of $I_g/I_d$ of about $6\times10^{-5}$ at 1.5 V can be reduced down to $1.5\times10^{-5}$ at 1.2 V. Further, the tunneling gate current $I_g$ can be reduced about 50%.

Figure 21:
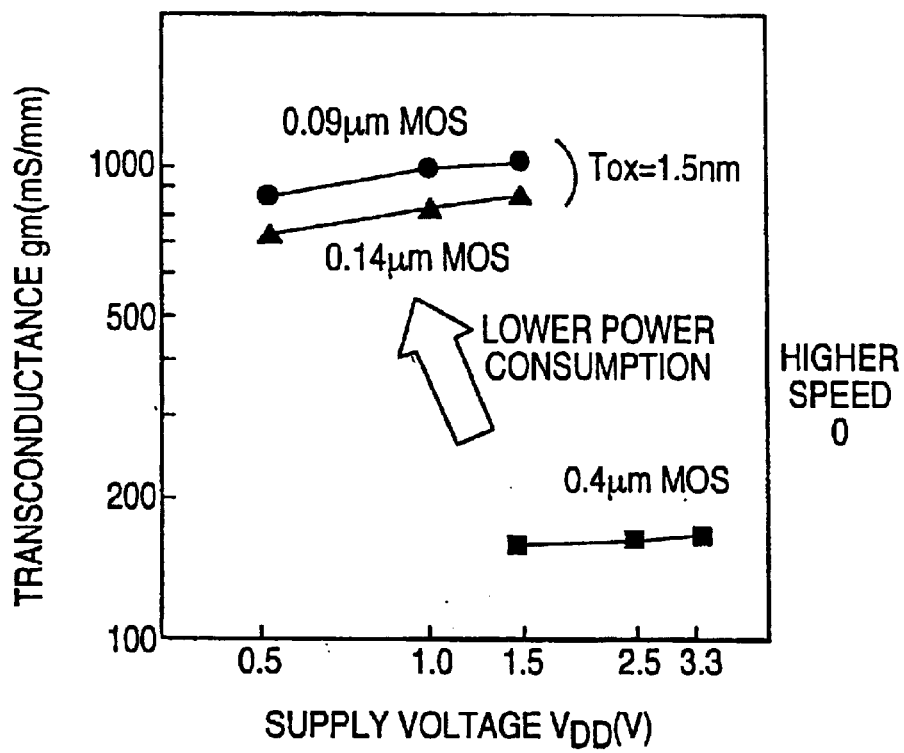
FIG. 21 is a graphical representation showing the dependance of the transconductance upon the supply voltage $V_{DD}$ in the same transistor.

On the other hand, however, in the case of the transconductance representative of the transistor performance, as shown in FIG. 21, when the supply voltage $V_{DD}$ is reduced from 1.5 V to 1.2 V, the transconductance gm is reduced only from 1010 mS/mm to 995 mS/mm; that is, the conductance can be reduced only 1.5%. Therefore, as far as the transistor is used in the circuit of the supply voltage $V_{DD}$ equal to or less than 1.2 V, it is possible to markedly improve the transistor performance owing to an increase of $I_g/I_d$ by 25%, as compared with when the supply voltage is 1.5 V.

Further, when the transistor of the present invention is used as a circuit of the supply voltage equal to or less than 0.5 V, as shown in FIG. 10, the gate leakage current $I_g$ can be reduced down to 1/20 or less, as compared with that obtained when the supply voltage is 1.5 V. Further, the gate leak current $I_g$ to the channel current $I_d$ can be reduced by about 80%. Therefore, when the transistor according to the present invention is used in a circuit of a supply voltage of 0.5 V or less, it is possible to realize a further higher performance transistor under low power consumption.

Figure 13A:
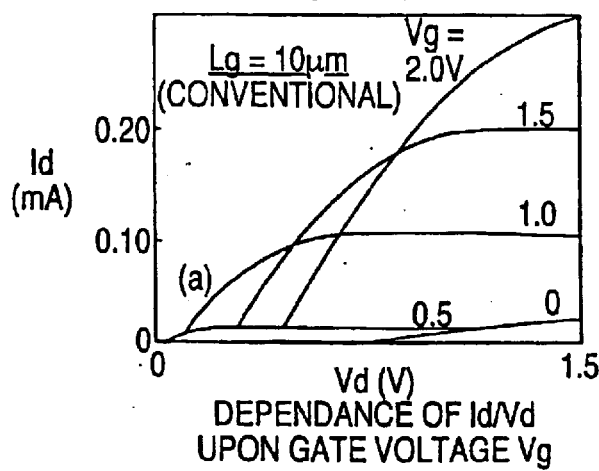
FIG. 13A is a graphical representation showing the dependence of the drain current $I_d$ characteristics upon the drain voltage $V_d$ in the prior art transistor with the gate voltage $V_g$ as a parameter.
Figure 13B:
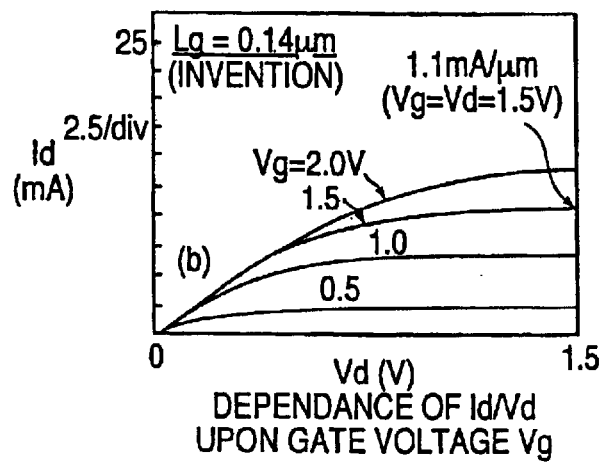
FIGS. 13B and 13C are graphical representations showing the dependance of the drain current $I_d$ characteristics upon the drain voltage $V_d$ in the same invention transistor with the gate voltage $V_g$ as a parameter.
Figure 13C:
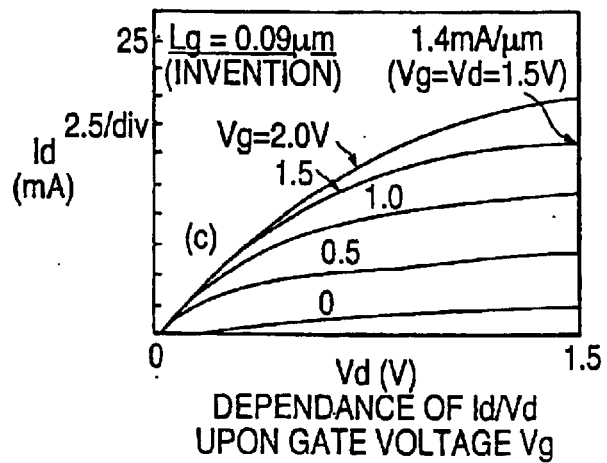
Figure 14A:
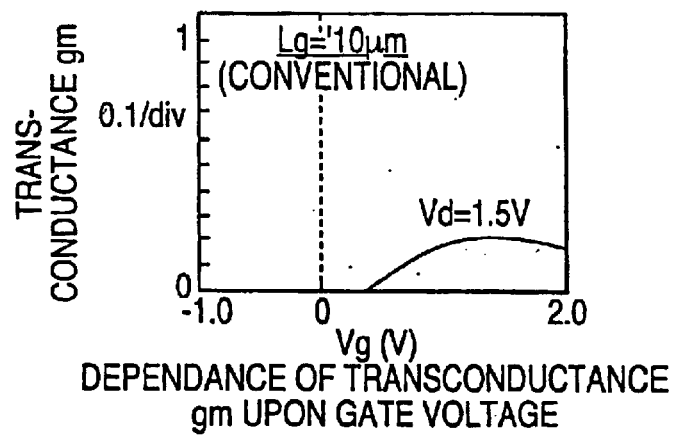
FIG. 14A is a graphical representation showing the dependence of the transconductance gm upon the gate voltage $V_g$ in the prior art transistor.
Figure 14B:
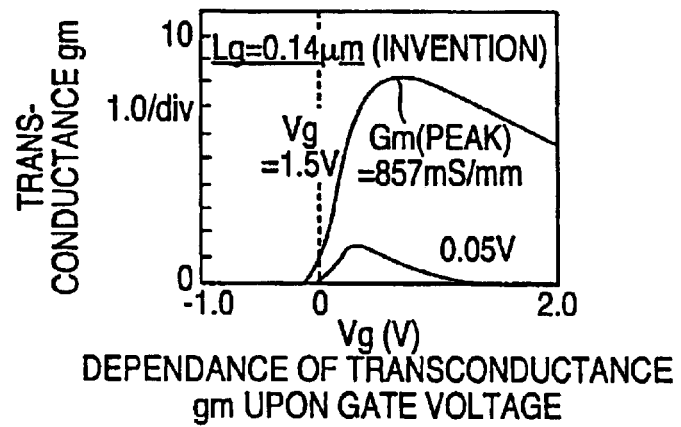
FIGS. 14B and 14C are graphical representations showing the dependance of the conductance gm upon the gate voltage $V_g$ in the same invention transistor.
Figure 14C:
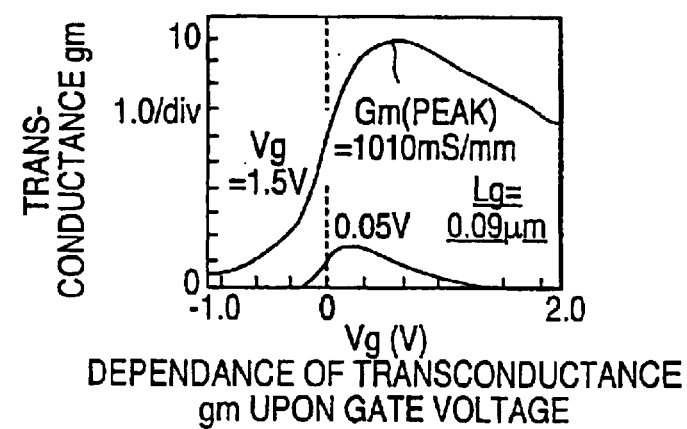

FIGS. 13A to 13C shows the dependance of the ($I_d$-$V_d$) characteristics upon the gate length $L_G$, and FIGS. 14A to 14D show the dependence of the transconductance gm upon the gate length $L_G$, respectively. In these graphs, the ($I_d$-$V_d$) characteristics and the gm sub-threshold characteristics are shown when the gate length $L_g$ is 10 $\mu$m (in FIGS. 13A and 14A), 0.14 $\mu$m (FIGS. 13B and 13B) and 0.09 $\mu$m (in FIGS. 13C and 13C), respectively. These graphs indicate that in the microstructure device according to the present invention, a large gate leakage current in the prior art transistor (the gate length $L_g$ is 10 $\mu$m shown in FIGS. 13A and 14A) can be suppressed. In addition, it is well understood that a high performance as gm=1010 mS/mm in $L_g$=0.09 $\mu$m can be obtained.

Figure 15A:
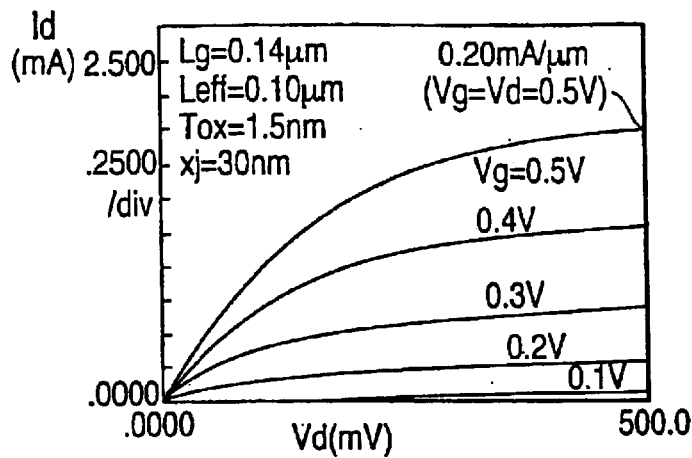
FIGS. 15A to 15C are graphical representations showing the major characteristics of the transistor according to the present invention.
Figure 15B:
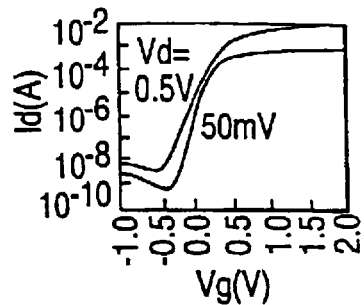
Figure 15C:
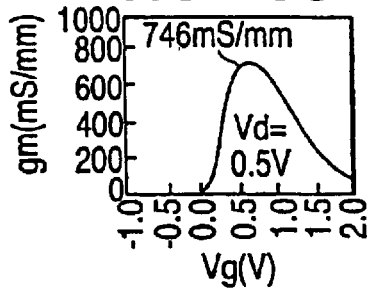
Figure 15D:
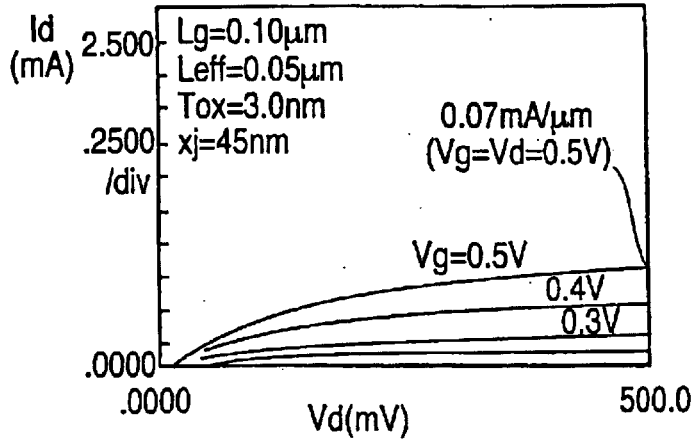
FIGS. 15D to 15F are graphical representations showing the characteristics of the prior art transistor, for comparison.
Figure 15E:
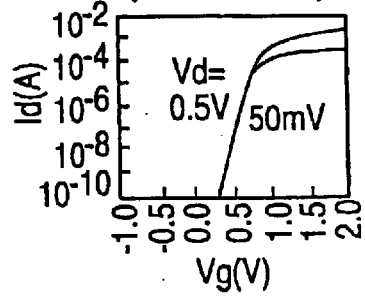
Figure 15F:
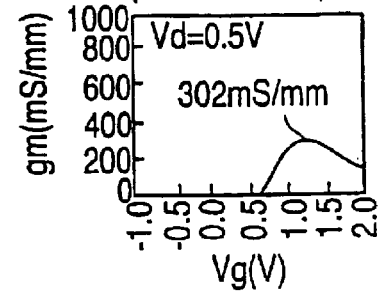

FIGS. 15A and 15B show the transistor characteristics when the supply voltage $V_d$ is 0.5 V or less. In this case, the gate voltage $V_g$ is also 0.5 V or less. In this case, the gate voltage $V_g$ is also 0.5 V or less. In these drawings, the major characteristics are shown in comparison between the invention transistor (FIG. 15A) and the prior art transistor (FIG. 15D). Here, the major characteristics are the current drive capability ($I_d$-$V_d$) characteristics; sub-threshold characteristics, the (log $I_d$-$V_g$) characteristics, and the transconductance (gm-$V_g$) characteristics. These drawings indicate that in the case of the invention transistor, a larger drain current $I_d$ and a large transconductance gm can be both obtained at a lower supply voltage, as compared with the prior art transistor, so that the overall characteristics of the invention transistor can be improved. For instance, in the invention transistor, in spite of such a low supply voltage as 0.5 V, an excellent transconductance gm as high as 746 mS/mm can be obtained.

Figure 20:
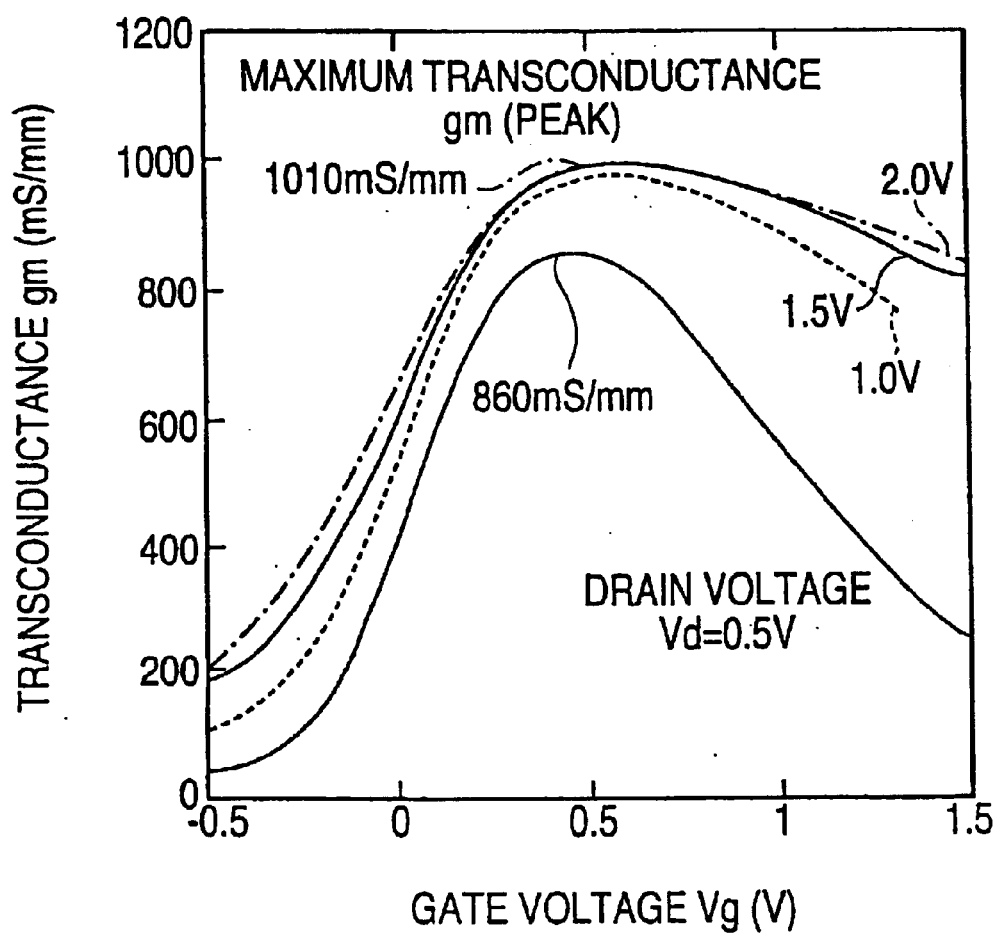
FIG. 20 is a graphical representation showing the dependance of the transconductance upon the gate voltage $V_g$ in the transistor with $L_g=0.09$ μm and $T_{OX}=1.5$ nm.

FIG. 20 shows the dependence of the transconductance gm upon the gate voltage $V_g$ in the invention transistor in which the gate length $L_g$ is 0.09 $\mu$m and the gate oxide film thickness $T_{OX}$ is 1.5 nm. FIG. 20 indicates that an excellent transconductance as high as 850 mS/mm can be obtained when the gate voltage $V_g$ is 0.5 V.

Figure 22:
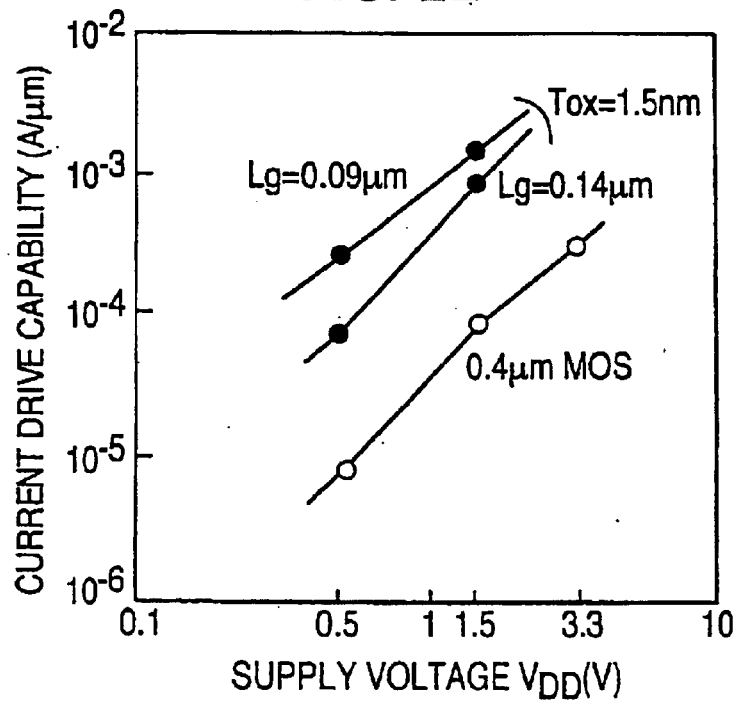
FIG. 22 is a graphical representation showing the dependance of the current drive capability (per unit length) upon the supply voltage $V_{DD}$.

FIGS. 21 and 22 show the dependance of the transconductance (FIG. 21) and the current drive capability (FIG. 22) upon the supply voltage $V_{DD}$ in the invention transistor (the gate length $L_g$ is 0.09 $\mu$m and 0.14 $\mu$m and the gate insulating film thickness $T_{OX}$ is 1.5 nm), in comparison with the prior art transistor (the gate length $L_g$ is 0.4 $\mu$m). Here, the gate film thickness of the prior art transistor is 9 nm.

In the recent general purpose microprocessor operable at 150 MHz, MOSFETs each having a gate length of about 0.4 $\mu$m are used. In these FETS, the transconductance thereof is about 200 mS/mm at a supply voltage of 3.3 V. Of course, it is impossible to obtain a high speed without reducing the wiring capacitances and the resistances. However, on the analogy of the transconductance of the elements, the high current drive capability MOSFET now realized has a possibility that the operating speed at 1.5 V can be increased about 5.7 times higher than that of the prior art transistor operated at 3.3 V. Further, since the transconductance at such a low voltage as 0.5 V is as high as 860 mS/mm, there exists a possibility that the power consumption can be reduced down to about 1/9 and the operating speed can be increased up to 5 times, as compared with the current transistor operation at 3.3 V.

The LSI now on the market (e.g., MPU microprocessor) operates under a supply voltage of 3.3 V and at a clock frequency of 200 MHz.

On the other hand, the invention transistor has a high current drive capability at a low supply voltage (e.g., 1.5 V or 0.5 V). Here, since the power consumption (P) is proportional to the square of the voltage (V), it is effective to reduce the supply voltage for realizing low power consumption operation. In general, however, since a decrease in supply voltage causes a decrease in the current drive capability of the transistor, the operating speed of the LSI is inevitably lowered. Therefore, a further higher speed is necessary for the LSI operation.

The power consumption of the LSI can be expressed as follows:

$$P = k f c V_{dd2} + (I_{ls} + I_{lg}) V_{dd}$$

where P: total power consumption of MPU f: clock frequency of MPU c: the MPU capacitance charged and discharged by the clock $V_{dd}$: supply voltage $I_{ls}$: drain leakage current in the sub-threshold region $I_{lg}$: gate leakage current In this expression, the first term $k f c V_{dd2}$ indicates the power consumed by charge and discharge, and the second term ($I_{ls} + I_{lg}$) indicates the power consumed by the leakage current component of the transistor.

Further, the clock frequency f is determined by the current drive capability I of the transistor.

The charge/discharge time t can be expressed as $$t = Q/I = c V/I, f = I/c V$$

Figure 25A:
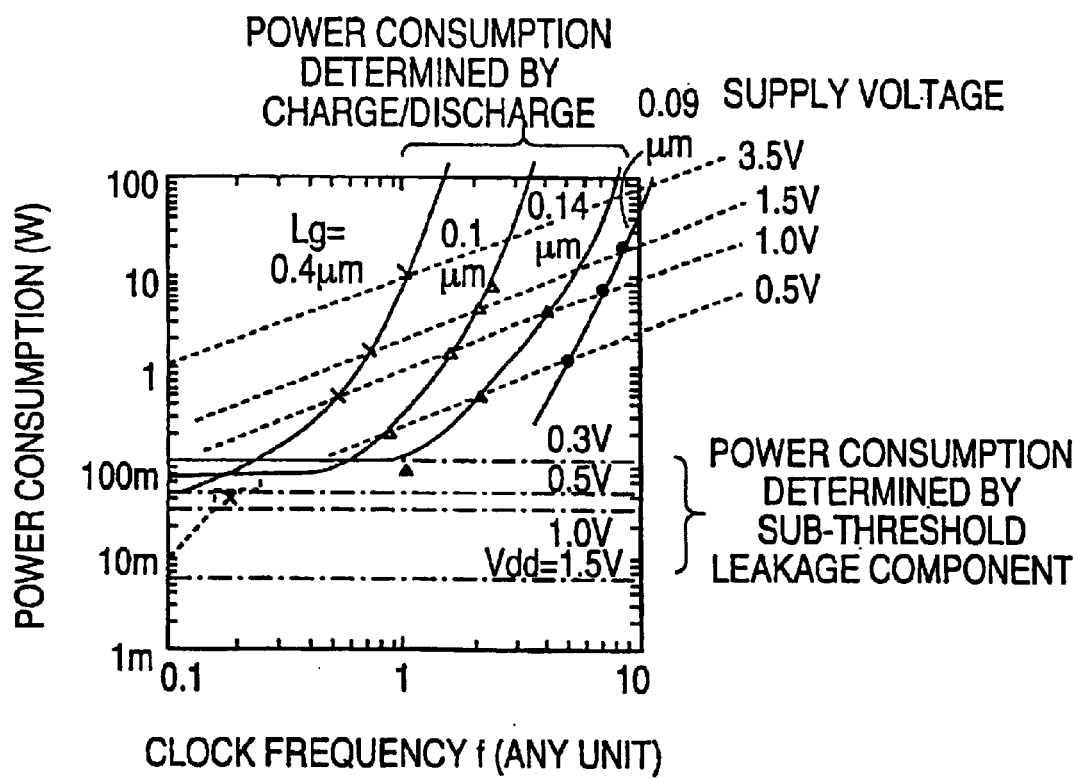
FIG. 25A is a graphical representation showing the relationship between clock frequency (f) and the power consumption of MPUs determined by both charge/discharge component and the subthreshold leakage current component, in which a first prior art transistor (having $L_g=0.4$ μm and $T_{OX}=9$ nm), a second prior art transistor (having $L_g=0.1$ μm and $T_{OX}=3$ nm), a first invention transistor (having $L_g=0.14$ μm and $T_{OX}=1.5$ nm), and a second invention transistor (having $L_g=0.09$ μm and $T_{OX}=1.5$ nm) are shown.
Figure 25B:
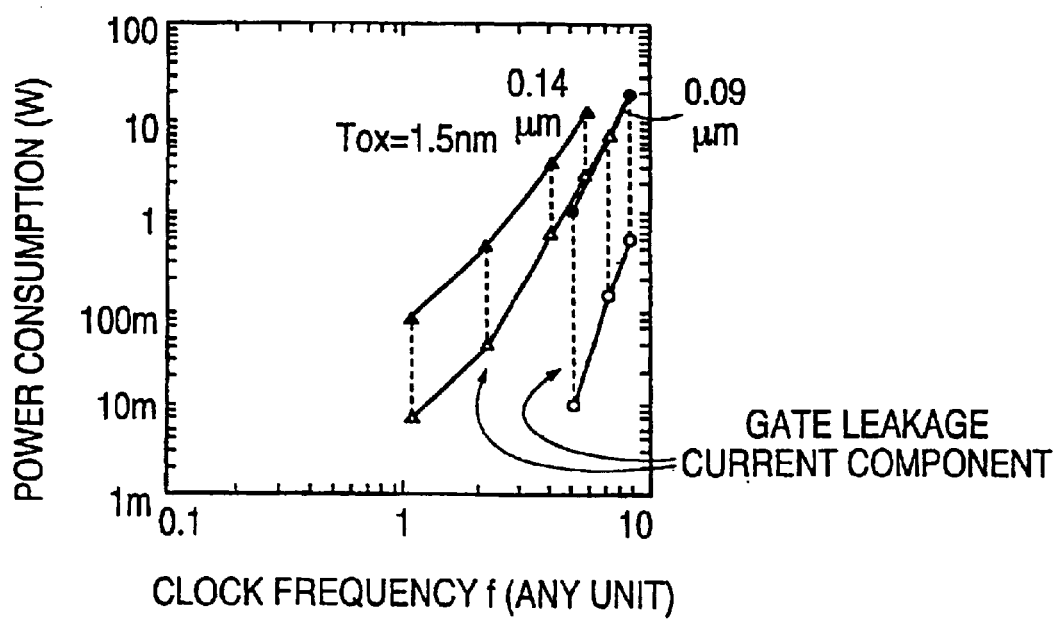
FIG. 25B is a graphical representation showing the relationship between clock frequency (f) and the power consumption of MPUs determined by only the gate leakage current component.

Here, FIG. 25A shows the relationship between the power consumption and the clock frequency in both the invention transistors and the prior art transistor ($L_g$=0.4 μm), in which the power consumption per chip is 10 W and the number of the chip transistors is $3 \times 10^6$. Here, the threshold voltage of each transistor was designed at threshold current 1 μA/μm as follows: 0.6 V when the supply voltage is 3.3 V; 0.4 V when the supply voltage is 2.0 V; 0.3 V when the supply voltage is 1.5 V; 0.2 V when the supply voltage is 1.0 V; 0.15 V when the supply voltage is 0.5 V; and 0.1 V when the supply voltage is 0.3 V.

Further, the relationship between the power consumption (P) and the clock frequency (f) can be divided into two ranges determined by the charge/discharge and the leakage current.

As shown in FIG. 25A, the components of the leakage current determined by the sub-threshold characteristics as follows:

when the supply voltage is 1.5 V, the threshold voltage is 0.3 V, and the power consumption due to the leakage current is 4.5 mW;

when the supply voltage is 1.0 V, since the threshold voltage is 0.2 V, the power consumption due to the leakage current is 30 mW;

when the supply voltage is 0.5 V, since the threshold voltage is 0.15 V, the power consumption due to the leakage current is 45 mW; and when the supply voltage is 0.3 V. since the threshold voltage is 0.1 V, the power consumption due to the leakage current is 100 mW.

On the other hand, when the tunnel gate oxide film of the present invention is used ($L_g$=0.14 μm and $T_{OX}$=1.5 nm), the leakage current is $6 \times 10^{-8}$ A/μm at 1.5 V supply voltage. Therefore, if the gate width per transistor is 10 μm and the number of the transistor is $3 \times 10^6$, the power consumption due to the leakage current is 2.7 W.

In summary, when the gate oxide film thickness is 1.5 nm and when the gate length $L_g$ is 0.14 μm, if the supply voltage is 1.5 V, the power consumption is 2.7 W;

if the supply voltage is 1.0 V, the power consumption is 600 mW;

if the supply voltage is 0.5 V, the power consumption is 45 mW, and if the supply voltage is 0.3 V, the power consumption is 6.3 mW.

Further, when the gate length $L_g$ is 0.09 μm, if the supply voltage is 1.5 V, the power consumption is 540 mW;

if the supply voltage is 1.0 V, the power consumption is 120 mW;

if the supply voltage is 0.5 V, the power consumption is 9 mW; and if the supply voltage is 0.3 V, the power consumption is 1.3 mW.

Further, as shown in FIG. 25A, the power consumption determined by charge/discharge is as follows, when the prior art transistor (in which $L_g$ is 0.4 μm, $T_{OX}$ is 9 nm, the supply voltage is 3.3 V, and the current drive capability is 0.40 mA/μm) is considered as the basis: in the transistor according to the present invention (in which $L_g$ is 0.14 μm, and $T_{OX}$ is 1.5 nm), the power consumption at the supply voltage of 1.5 V is 1.2 times larger than that of the prior art transistor, and the clock frequency thereof is 5.7 times higher than that of the prior art transistor. However, the power consumption of the invention transistor at the supply voltage of 0.5 V is 0.047 times smaller than that of the prior art transistor, and the clock frequency thereof is 2.1 times higher than that of the prior art transistor.

Further, in the transistor according to the present invention (in which $L_g$ is 0.09 μm, and $T_{OX}$ is 1.5 nm), the power consumption at the supply voltage of 1.5 V is 1.8 times larger than that of the prior art transistor, and the clock frequency thereof is 8.6 times higher than that of the prior art transistor. However, the power consumption of the invention transistor at the supply voltage of 0.5 V is 0.11 times smaller than that of the prior art transistor, and the clock frequency thereof is 4.9 times higher than that of the prior art transistor.

Further, the above-mentioned gate leakage current component is sufficiently smaller (by one digit) than the substantial power consumption component due to charge/discharge, so that no serious problem arises.

Figure 26:
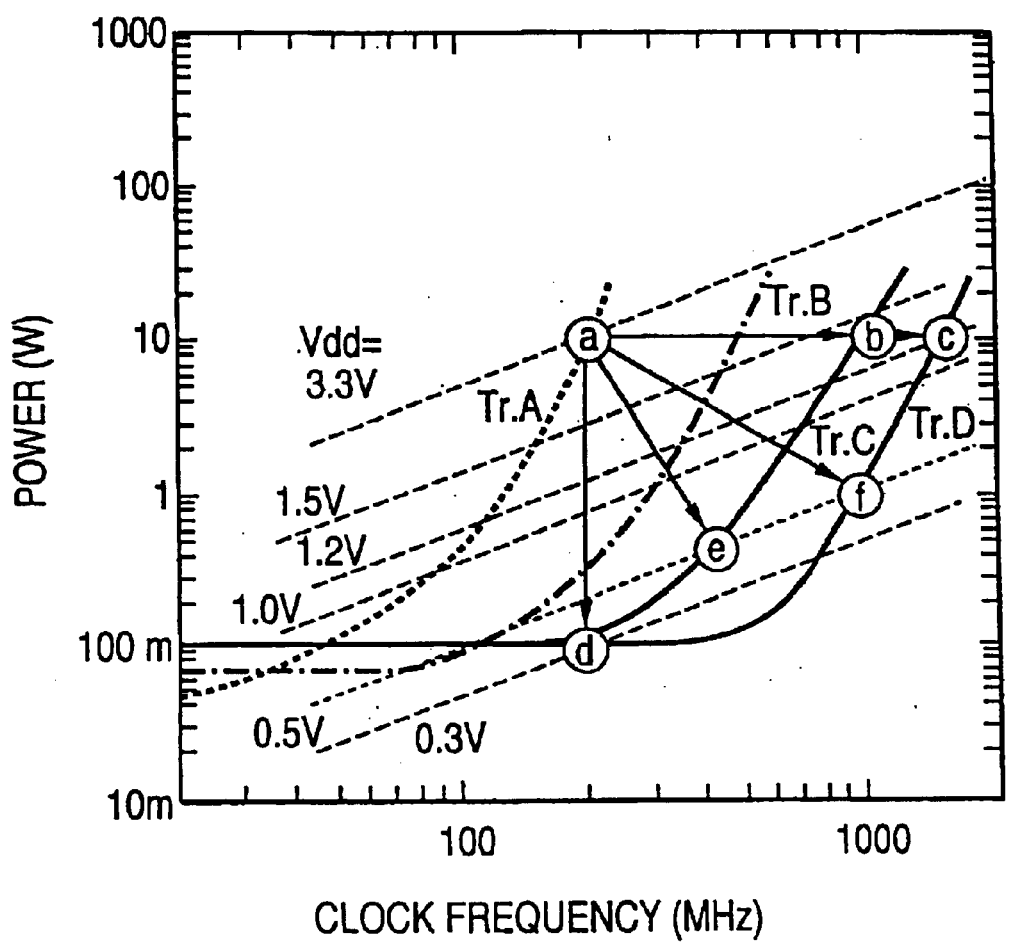
FIG. 26 is a graphical representation showing the relationship between clock frequency (f) and the power consumption of MPUs under the same clock frequency conditions and the same power consumption conditions for all the transistors, in which a first prior art transistor (having $L_g=0.4$ μm and $T_{OX}=9$ nm), a second prior art transistor (having $L_g=0.1$ μm and $T_{OX}=3$ nm), a first invention transistor (having $L_g=0.14$ μm and $T_{OX}=1.5$ nm), and a second invention transistor (having $L_g=0.09$ μm and $T_{OX}=1.5$ nm) are shown.

FIG. 26 is a graphical representation showing the relationship between clock frequency (f) and the power consumption of MPUs under the same clock frequency conditions and the same power consumption conditions for all the transistors. In this figure, there are shown transistor A is a MOSFET used in today's MPU, which has $L_g$=0.4 μm and $T_{OX}$=9 nm, transistor B is a conventional 0.1 μm MOSFET, which has $L_g$=0.1 μm and $T_{OX}$=3 nm, transistor C is a tunneling gate oxide MOSFET according to the invention having $L_g$=0.14 μm and $T_{OX}$=1.5 nm, and transistor D is a tunneling gate oxide MOSFET according to the invention having $L_g$=0.09 μm and $T_{OX}$=1.5 nm.

Letters in circles denote improvements of operation performances. Condition b (1.3V operation) of transistor C shows that power consumption is the same and frequency becomes 5.5 times of those of condition a of the transistor A. In condition c (1.2V operation), power consumption is the same and frequency becomes 7.8 times. In condition d (0.3V operation) power consumption becomes 1/100 at the same frequency. In condition e (0.5V operation), power consumption becomes 1/20 while operation frequency is increased to 2.1 times. In condition f(0.5V operation), power consumption becomes 1/5 while operation frequency is increased to five times.

Consequently, as shown in FIG. 26, as compared with the prior art transistor operated at 200 MHz and 3.3 V supply voltage (condition a) when the transistor of the present invention is operated at 1.3 V, it is possible to realize a high frequency operation (about 1000 MHz) (condition b) approximately five times higher than that of the prior art transistor under the same power consumption. Further, when the transistor of the present invention is operated at 0.5 V, it is possible to realize a high clock operation (condition f) five times higher than that of the prior art transistor, in spite of a low power consumption 1/5 times lower than that of the prior art transistor.

Further, when operated at 200 MHz (condition d), the supply voltage can be reduced down to 0.3 V and thereby the power consumption can be reduced down to 1/100 of the prior art transistor (less than 100 mW).

In addition, since the transistor according to the present invention has a high transconductance and thereby a high current drive capability at even a low supply voltage (1010 mS/mm at 1.5 V and 860 mS/mm at 0.5 V), it is possible to realize a high-frequency operation about 5 times higher than the prior art transistor (about 200 mS/mm at 3 V).

For instance, although bipolar or GaAs transistors have been so far used as high-frequency (one to several tens GHz) analog ICs for communications, it is possible to replace these high-frequency transistors with the CMOS EFTs according to the present invention.

For achieving a higher integration rate and a higher operation speed of LSI, the MOS transistors have been so far down-sized. For higher speed, although it is of course important to reduce the capacitance and resistance of wiring and further to decrease the parasitic capacitance and parasitic resistance of the elements, an essential point for higher current drive capability is the down-sizing of the elements themselves. Therefore, in the future, devices operable at further lower supply voltage will be required under further lower power consumption. In this case, however, the essential problem to be solved is how to form the transistor of high current drive capability even at a low supply voltage.

Further, in the case of the ordinary transistors, the transconductance gm so far obtained at the supply voltage of 1.8 V is 480 mS/mm or less in the nMOS of a channel length of 0.05 μm (the gate length is presumed to be 0.10 μm), and 250 mS/mm or less in the pMOS of a channel length of 0.06 μm (the gate length is presumed to be 0.14 μm), (for instance, as reported by Document ((Writer): G. G. Shahidi, J. Warnock, A. Acovic, P. Agnello, C. Blair, C. Bucelot, A. Burghartz, E. Crabbe, J. Cressler, P. Coane, J. Comfort, B. Davarl, S. Fischer, E. Ganin, S. Gittleman, J. Keller, K. Jenkins, D. Klans, K. Kiewtniak, T. Lu, P. A. McFarland, T. Ning, M. Polcari, S. Subbana, J. Y. Sun, D. Sunderland, A. C. Warren, C. Wong; (Title) A HIGH PERFORMANCE 0.15 μm CMOS; (Source) Dig. Of Tech. Paper, VLSI Symp. On Tech. Kyoto. pp. 93–94, 1993 (referred to as a document (A), hereinafter).

On the other hand, the transconductance gm so far obtained at the supply voltage of 1.5 V is only 620 mS/mm in the nMOS of a channel length of 0.09 μm (the gate length is presumed to be 0.14 μm), and only 290 mS/mm in the pMOS of a channel length of 0.11 μm (the gate length is presumed to be 0.19 μm), [as reported by Document ((Writer): Y. Taur, S. Wind, Y. J. Mii, Y. Lii. D. Moy, K. A. Jenkins, C. L. Chen, P. J. Coane, D. Klaus, J. Bucchignano, M. Rosenfield, M. G. R. Thomson, and M. Polcari; (Title) High Performance 0.1 μm CMOS Device with 1.5 V Power Supply; (Source) IEDM Tech. Dig. pp. 127–130, 1993, (referred to as a document [C], hereinafter)].

Further, the transconductance gm so far obtained at the supply voltage of 1.5 V is 740 mS/mm in the nMOS of a channel length of 0.05 μm (the gate length is presumed to be 0.10 μm), [as reported by Document ((Writer): Y. Mii, S. Rishton, Y. Teur, D. Kern, T, Lii, K. Lee, K. Jenkins, D. Quinlan, T. Bronwn, Jr. D. Danncr, F. Sewell, and M. Polcari; (Title) High Performance 0.1 μm nMOSFETs with 10 ps/stage Delay (85 k) at 1.5 V Power supply; (Source) Dig. of Tech. Paper. VLSI Symp. on Tech Kyoto, pp. 91–92, 1993, (referred to as a document [D], hereinafter)].

Further, the transconductance gm so far obtained at the supply voltage of 0.5 V is only 340 mS/mm in the nMOS of a channel length of 0.12 μm (the gate length is presumed to be 0.17 μm), and only 140 mS/mm in the pMOS of a channel length of 0.12 μm (the gate length is presumed to be 0.2 μm), [as reported by Document ((Writer): Y. Mii, S. Wind, Y. Lii, D. Klaus, and J. Bucchignano; (Title) An Ultra-Low Power 0.1 μm CMOS; (Source) Dig. of Tech. Papers, VLSI Symp. on Tech. Hawaii. pp. 9–10, 1994, (referred to as a document [B], hereinafter)].

Further, as an example of high performance p-channel MOSFET, the transconductance gm so far obtained at the supply voltage of 1.5 V is 400 mS/mm in the case where the gate oxide film thickness is 3.5 nm and the effective channel length is 0.08 μm (the gate length is presumed to be 0.15 μm), and 330 mS/mm in the case where the effective channel length is 0.11 μm (the gate length is presumed to be 0.18 μm), [as reported by Document ((Writer): Y. Taur, S. Cohen, S. Wind, T. Lii, C. Hsu, D. Quinlan, C. Chang, D. Buchanan, P. Agnello, Y. Mii, C. Reeves, A. Acovic and V. Kasan: (Title) High Transconductance 0.1 μm pMOSFET; (Source) IEDM Tech. Dig. pp. 901–904, 1992, (referred to as a document [E], hereinafter)].

Therefore, in order to obtain the performance such that the transconductance gm at a supply voltage of 1.5 V or higher is 740 mS/mm or more in an nMOS and 400 mS/mm or more in a pMOS; gm at a supply voltage of 1.2 V or higher is 540 mS/mm or more in an nMOS and 245 mS/mm or more in a pMOS; gm at a supply voltage of 0.5 V or higher is 340 mS/mm or more in an nMOS and 140 mS/mm or more in a pMOS, it is necessary that the transistor is constructed in accordance with the features of the present invention.

Similarly, in general, the current drive capability stays such a value as 0.052 mA/μm in nMOS and 0.032 mA/μm in pMOS when the supply voltage is 0.5 V, for instance, as reported by Document [B]. Further, the current drive capability stays such a value as 0.65 mA/μm in nMOS and 0.51 mA/μm in pMOS when the supply voltage is 1.5 V, for instance, as reported by Document [C].

Therefore, in order to obtain the current drive capability such values as 0.65 mA/μm or more in nMOS and 0.51 mA/μm or more in pMOS when the supply voltage is 1.5 V or higher; as 0.47 mA/μm or more in nMOS and 0.22 mA/μm or more in pMOS when the supply voltage is 1.2 V or higher; and 0.052 mA/μm or more in nMOS and 0.032 mA/μm or more in pMOS when the supply voltage is 0.5 V or higher, it is necessary that the transistor is constructed in accordance with the features of the present invention.

Here, the above-mentioned characteristics of the transconductance and the current drive capability are both obtained at room temperature. Therefore, the structural feature of the transistor according to the present invention under the supply voltage $V_{DD}$ can be expressed as follows:

$$gm > 400 V_{DD} + 140 \text{(in nMOS)}$$

$$gm > 260 V_{DD} + 10 \text{(in pMOS)}$$

where $V_{DD}$ denotes the supply voltage (V in unit) and gm denotes the transconductance (mS/mm in unit).

Further, the structural feature of the transistor according to the present invention with respect to the current drive capability can be expressed as follows:

$$I_d > 0.598 V_{DD} - 0.247 \text{(in nMOS)}$$

$$I_d > 0.268 V_{DD} - 0.102 \text{(in pMOS)}$$

where $V_{DD}$ denotes the supply voltage (V on unit) and $I_d$ denotes the drain current (mA in unit).

Further, in the above-mentioned values, although not described, the gate length $L_g$ lies in the vicinity of 0.1 µm in all the cases.

Here, it has been well known that the current drive capability of the MOSFET can be increased effectively by the method of increasing the moving speed of electrons and holes, that is, by shortening the gate length and by increasing the channel field strength. In this method of decreasing the gate length and increasing the channel field strength, however, in the case where the gate length approaches 0.1 µm or less, the speed saturation phenomenon occurs (i.e., when the channel field strength increases to some extent, the moving speed of the electrons or holes is saturated and thereby cannot be increased), so that the current drive speed of the transistor is saturated.

Last year, as the small geometry MOSFET, the Inventors have manufactured an nMOSFET having the minimum gate length of 0.04 µm in the world, and further reported the operation at room temperature. In this report, the current drive capability was improved only by 20 to 30%, as compared with that of the transistor with a gate length of 1 µm.

Accordingly, the afore-mentioned transconductance and the current drive capability cannot be realized by the conventional method so far reported, and can be realized in accordance with only the structure defined by the present invention.

Further, in the ordinary MOSFET having no tunneling gate oxide film of the present invention, the transconductance of 740 mS/mm at a supply voltage of 1.5 V has been obtained in an nMOS (the effective channel length ($L_{eff}$) is 0.05 µm and the gate oxide film thickness ($T_{OX}$) is 3.5 nm), as disclosed in Document [D]. The gate length $L_g$ of this transistor can be presumed to be 0.10 µm. The value of this transconductance indicates the highest performance of the prior art MOSFET having a gate length of 0.1 µm. Further, in the above-mentioned transistor having an effective channel length of 0.1 µm (the gate length is presumed to be 0.13 µm) of the prior art structure, the transconductance of 620 mS/mm has been obtained, which has been the highest performance obtained by the MOSFET having a gate length of 0.15 µm of the prior art structure.

Further, the inversion layer capacitance of the MOSFET according to the present invention is equivalent to that of the gate oxide film with a thickness of about 0.5 nm on the basis of the estimation of the surface carrier concentration.

Accordingly, in the transistor according to the present invention which has a gate oxide film thickness less than 2.5 nm, the following transconductance gm can be realized:

gm>740×(3.5+0.5)/(2.5+0.5)≈990 mS/mm in the device having a gate length of 0.1 µm, and gm>620×(3.5+0.5)/(2.5+0.5)≈830 mS/mm in the device having a gate length of 0.15 µm.

In other words, in order to obtain gm of 990 mS/mm at the gate length of 0.1 µm and gm of 830 mS/mm at the gate length of 0.15 µm, it is essential to adopt the tunnel gate oxide film with a film thickness of less than 2.5 nm, as the basic feature of the transistor according to the present invention.

Further, at the same time, the maximum value of the current drive capability of the prior art transistor is 0.66 mA/mm at 1.5V supply voltage, as disclosed in Document [C]. This value has been obtained by the transistor (the effective channel length $L_{eff}$ is 0.09 µm and the gate length is presumed to be 0.15 µm). Further, when the device of the gate length of 0.10 µm is realized in the prior art structure, the current drive capability can be presumed to be 0.77 mA/µm.

Accordingly, in the transistor according to the present invention having a gate oxide film thickness less than 2.5 nm, the following current drive capability $I_d$ can be realized:

$I_d$>0.77×(3.5+0.5)/(2.5+0.5)≈1.0 mA/mm in the device having a gate length of 0.1 µm, and $I_d$>0.65×(3.5+0.5)/(2.5+0.5)≈0.87 mA/mm in the device having a gate length of 0.15 µm.

In other words, in order to obtain $I_d$ of 1.0 mS/mm at the gate length of 0.1 µm and $I_d$ of 0.87 mS/mm at the gate length of 0.15 µm at 1.5V supply voltage, it is essential to adopt the tunneling gate oxide film with a film thickness of less than 2.5 nm, as the basic feature of the transistor according to the present invention.

Further, as an example of the high performance p-channel MOSFET, Document [E] reports that gm is 400 mS/mm and $I_d$ is 0.51 mA/mm, (when the supply voltage is 1.5 V, the gate oxide film thickness is 3.5 nm, the effective channel length is 0.08 µm, and the gate length is presumed to be 0.15 µm), and that gm is 330 mS/mm and $I_d$ is 0.44 mA/mm (when the effective channel length is 0.11 µm, and the gate length is presumed to be 0.18 µm).

In the same way as with the case of the n-channel MOSFET, in the transistor of the structure according to the present invention having a gate oxide film thickness less than 2.5 nm, it is possible to realize such a high performance that gm is 533 mS/mm and $I_d$ is 0.68 mA/mm at the gate length of 0.15 µm, and that gm is 400 mS/mm and $I_d$ is 0.59 mA/mm at the gate length of 0.18 µm.

In the devices of the respective gate lengths, in order to obtain the performance more than the above-mentioned values, it is essential to adopt the tunnel oxide film having a thickness less than 2.5 nm, as the basic feature of the transistor structure according to the present invention.

In other words, it is indispensable to apply the gate oxide film having a film thickness less than 2.5 nm to the transistor according to the present invention, as the basic element, in order to realize the transistors which can satisfy the relationship between the supply voltage $V_{dd}$ and the transconductance gm or the current drive capability $I_d$ as follows:

$$gm > 530 \times V_{dd} + 190 \text{(in nMOS)}$$

$$gm > 350 \times V_{dd} + 13 \text{(in pMOS)}$$

$$I_d > 0.80 \times V_{dd} - 0.33 \text{(in nMOS)}$$

$$I_d > 0.36 \times V_{dd} - 0.14 \text{(in pMOS)}$$

where $V_{dd}$ is V in unit, gm is mS/mm in unit, and $I_d$ is mA/mm in unit, respectively.

As described above, the present invention can provide a transistor excellent in both current drive capability and reliability, as compared with the prior art transistors.

In the above description, the transistor according to the present invention has been explained by using a silicon oxide film as the gate insulating film. In the present invention, however, the same effect as described above can be obtained, as far as an insulating film having a gate capacitance equivalent thereto is used. That is, as the insulating film, various films can be used, for instance as follows: silicon nitride film ($Si_3N_4$), silicon nitric oxide film ($SiO_xN_y$), a stacked film of silicon nitride film and silicon oxide film ($SiO_2/Si_3N_4$, $Si_3N_4/SiO_2$, $SiO_2/Si_3N_4/SiO_2$, $Si_3N_4/SiO_2/N_4$), a laminated layer of tantalum oxide ($TaO_x$), titanium oxide strontium ($TiSr_xO_y$) and its silicon oxide film or silicon nitride film, etc. As far as the gate capacitance of these insulating films is equivalent to the silicon oxide film having a film thickness less than 2.5 nm (at the conversion rate to silicon oxide film), the effect of the present invention can be obtained. For instance, since the dielectric constant of silicon nitride film is 7.9 (about twice larger than that (3.9) of silicon oxide film), when the silicon nitride film is used, the same effect as the present invention can be obtained when the film thickness is less than 5 nm. When any of the above-mentioned insulating films is used, even if tunneling leakage current flows through the gate insulating film, this coincides with the techniques of the present invention such that the transistor is constructed in such a way that the insulating film thickness is so determined that the tunneling current flows through the silicon oxide film, with the result that the same effect can be obtained. Further, as far as the insulating film having the gate capacitance equivalent to the silicon oxide film whose thickness is less than 2.5 nm is used, an insulating film through which no tunneling current flows can be used. In this case, the power consumption can be reduced, and thereby it is possible to realize a high-performance transistor of lower power consumption.

For instance, when one million MOSFETs each having leakage current of $10^{-8}$ A are integrated, the total power consumption is 10 mA. On the other hand, when the transistors in each of which no tunneling current flows are used, the power consumption of 10 mA can be suppressed, the performance as the LSI can be improved.

Further, when the transistors according to the present invention are used as a part of the semiconductor device, it is possible to realize a high-performance and low-costly semiconductor device.

Figure 18A:
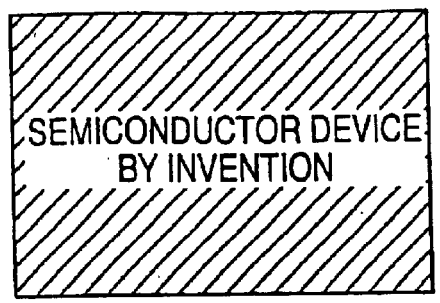
FIG. 18A is an illustration showing an example of the semiconductor device, in which the whole area of the semiconductor device is formed by the transistors according to the present invention.
Figure 18B:
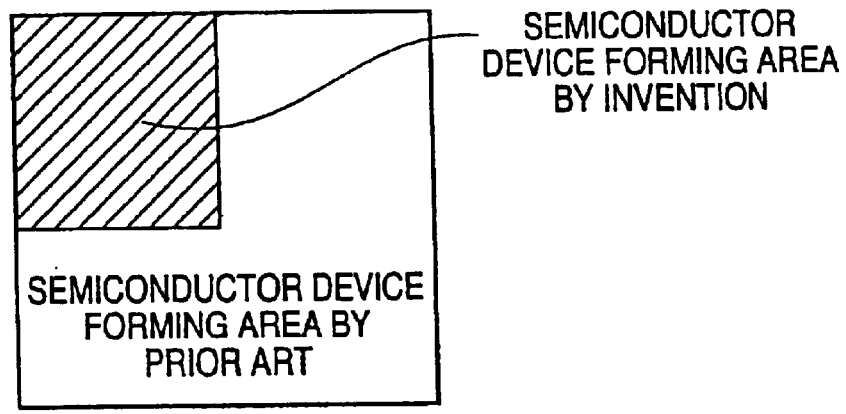
FIG. 18B is an illustration showing the semiconductor device, in which the MOSFETs of the present invention are manufactured at a part of the area of the device.
Figure 18C:
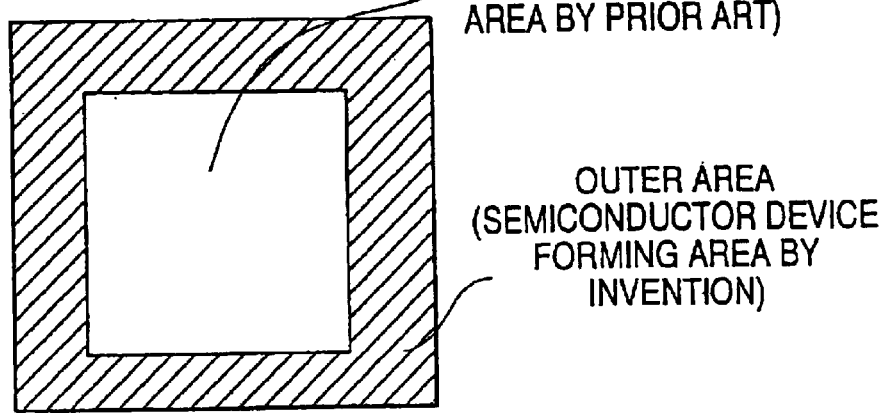
FIG. 18C is an illustration showing the semiconductor device, in which the MOSFETs of the present invention are manufactured at the peripheral area of the device.

FIG. 18A shows the semiconductor device using only the transistors of the present invention, and FIG. 18B shows a semiconductor device in which the transistors of the present invention are used as a part of the semiconductor device. In particular, it is preferable that the transistors of the present invention are used for a part of the peripheral circuit required to be driven by a large current, as shown in FIG. 18B. The semiconductor device as shown in FIG. 18B can be manufactured as follows:

After isolation regions have been formed in accordance with the conventional method, the silicon surface is oxidized at 800° C. within oxygen atmosphere in accordance with furnace oxidization method, for instance to form a first silicon oxide film with a thickness of 4 nm. After that, the first silicon oxide film is removed only from the region at which the transistors according to the present invention are to be formed. Further, a second silicon oxide film with any desired film thickness is formed in accordance with RTO (rapid thermal oxidation) method. After that, the transistors of the present invention can be manufactured in accordance with the same process as already described.

Figure 19:
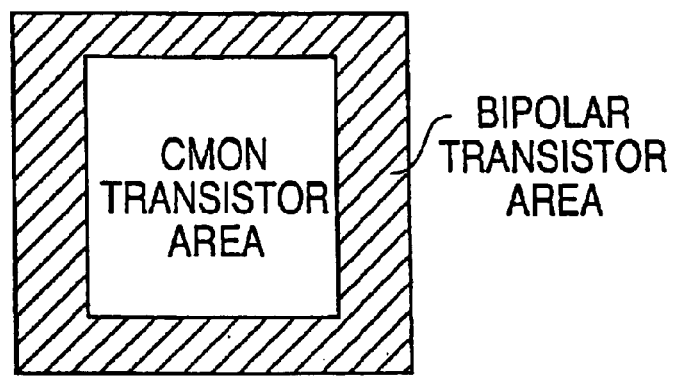
FIG. 19 is an illustration for assistance in explaining the construction of the prior art high-speed semiconductor device formed by the bipolar transistors (at the peripheral portion) and the CMOS transistors (at the core portion) in combination.

In the semiconductor device manufactured as described above, the high performance transistors manufactured according to the present invention are formed at only an area at which transistors driven by a large current are required, so that it is possible to provide a semiconductor device excellent as a whole. In the prior art semiconductor device, as shown in FIG. 19, the peripheral circuit portion (I/O portion) is formed by bipolar transistors, and the internal logic circuits are formed by CMOS transistors to increase the operating speed.

In the semiconductor device according to the present invention, since the device can be manufactured through only the CMOS manufacturing process, it is possible to realize a high performance low-costly semiconductor device.

Further, in the transistor according to the present invention, since the gate insulating film thickness is as very thin as 2.5 nm, when surge gate voltage (noise) is applied; that is, when an excessive voltage exceeding the supply voltage is applied to the gate insulating film in LSI operation, there arises a problem in that the gate insulation is broken down (gate breakdown), so that the MOSFET cannot operate normally.

Figure 28A:
FIG. 28A is a circuit diagram showing the structure of the semijconductor device according to the present invention.
Figure 28B:
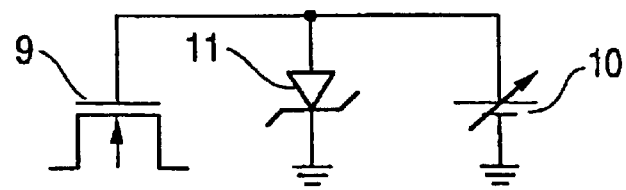
FIG. 28B is a circuit diagram showing the structure of the MOSFET having a Schtokky diode to protect the gate insulating film of the transistor according to the present invention.

To overcome this problem, as show in FIG. 28B, a Schottky diode 11 formed of a metal/silicon layer is connected to the gate of the transistor of the present invention as shown in FIG. 28A, as a protective circuit. The breakdown voltage of this Schottky diode 11 is arranged to be lower than that of the transistor 9 of the present invention.

As the Schottky diode 11, any of n-type silicon and p-type silicon can be used. Further, as the metal, Al, W, Ti, Mo, Ni, V, Co, etc. can be used as the main component.

When the Schottky diode 11 is connected to the gate of the transistor, even if excessive surge (noise) voltage is applied, since the Schottky diode is first broken down, it is possible to protect the gate insulating film of the transistor 9 from being broken down by an excessive current flowing through the gate thereof. In other words, it is possible to realize a semiconductor device having the transistors resistance against the electrostatic breakdown.

The present invention has been explained by taking the case of nMOSFET in particular. However, the structure of the present invention can be applied to pMOSFET in the same way. In this case, the gate side wall portion is formed by BSG (a silicon oxide film containing boron), and a shallow p-type source/drain region is formed, [as reported by Document (Writer): M. Saito, T. Yoshitomi, H. Hara, M. Ono, Y. Akasaka, H. Nii, S. Matsuda, H. S. Momose, V. Katsumata, and H. Iwai; (Title) P-MOSFETs with Ultra-Shallow Solid-Phase-Diffused Drain Structure Produced by Diffusion from BSG Gate-Sidewall; (Source) IEEE Tans. Electron Devices, vol. ED-40, no. 12, pp. 2264–2272 December, 1993)].

Further, without using the solid-phase diffusion technique from the BSG side wall as described above, it is also possible to manufacture the source/drain diffusion layer in accordance with the ordinary B (boron) ion implantation method.

Figure 24A:
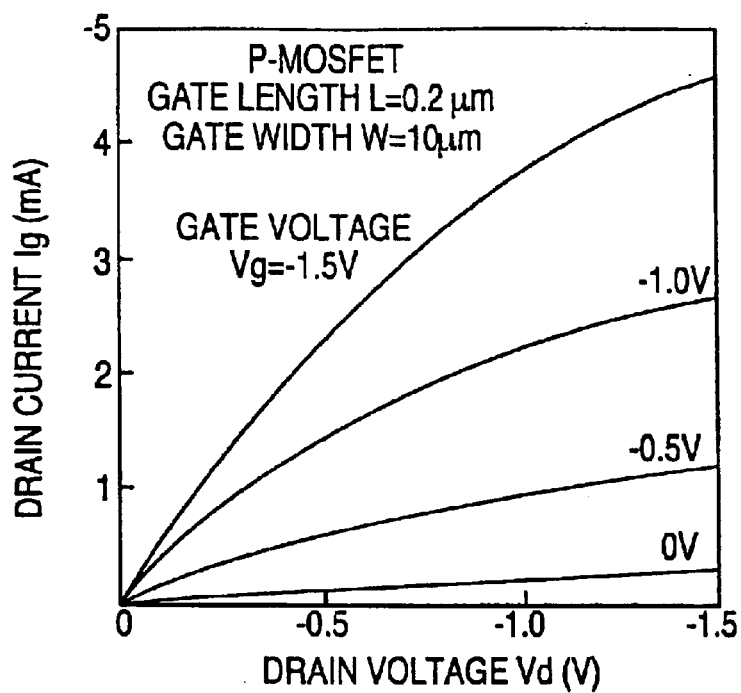
FIG. 24A is a graphical representation showing $(I_d-V_D)$ characteristics of pMOS transistor having $T_{OX}=1.5$ nm and $L_g=0.2$ μm.
Figure 24B:
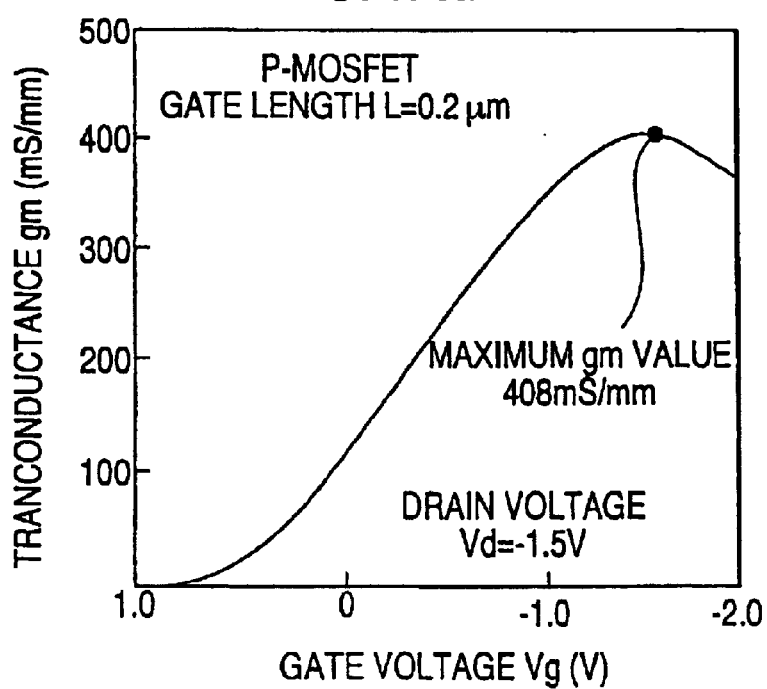
FIG. 24B is a graphical representation showing (gm–$V_G$) characteristics of the same transistor shown in FIG. 24A.

FIGS. 24A and 24B show the electric characteristics of the pMOSFET whose source/drain diffusion layer is formed by the ion implantation method, in which the gate oxide film thickness is 1.5 nm and the gate length is 0.2 μm. In the pMOSFET manufactured as described above, the current drive capability is 0.41 mA/μm and the transconductance is 408 mA/mm at the supply voltage of 1.5 V. Further, this transistor has the current drive capability of 0.06 mA/μm and the transconductance of about 350 mS/mm at the supply voltage of 0.5 V. The above-mentioned performance is very high, as compared with the prior art pMOSFET (about 200 mS/mm in the gate length of 0.2 µm), [as reported by Document (Writer): Y. Taur, S. Wind, Y. J. Mii, D. Moy, K. A. Jenkins, C. L. Chen, P. J. Coane, D. Klans, J. Bucchignano, M. G. R. Thomson, and M. Polcari; (Title): High Performance 0.1 µm CMOS Devices with 1.5 V Power Supply; (Source): IEDM Tech. Dig. pp. 127–130, 1993)].

Further, in the above-mentioned description, an example of the diffusion layer depth of 30 nm has been explained. However, it is possible to freely select any desired diffusion layer depth by appropriately selecting the annealing conditions (for diffusion and activation) between 700° C. and 1100° C.

Figure 23:
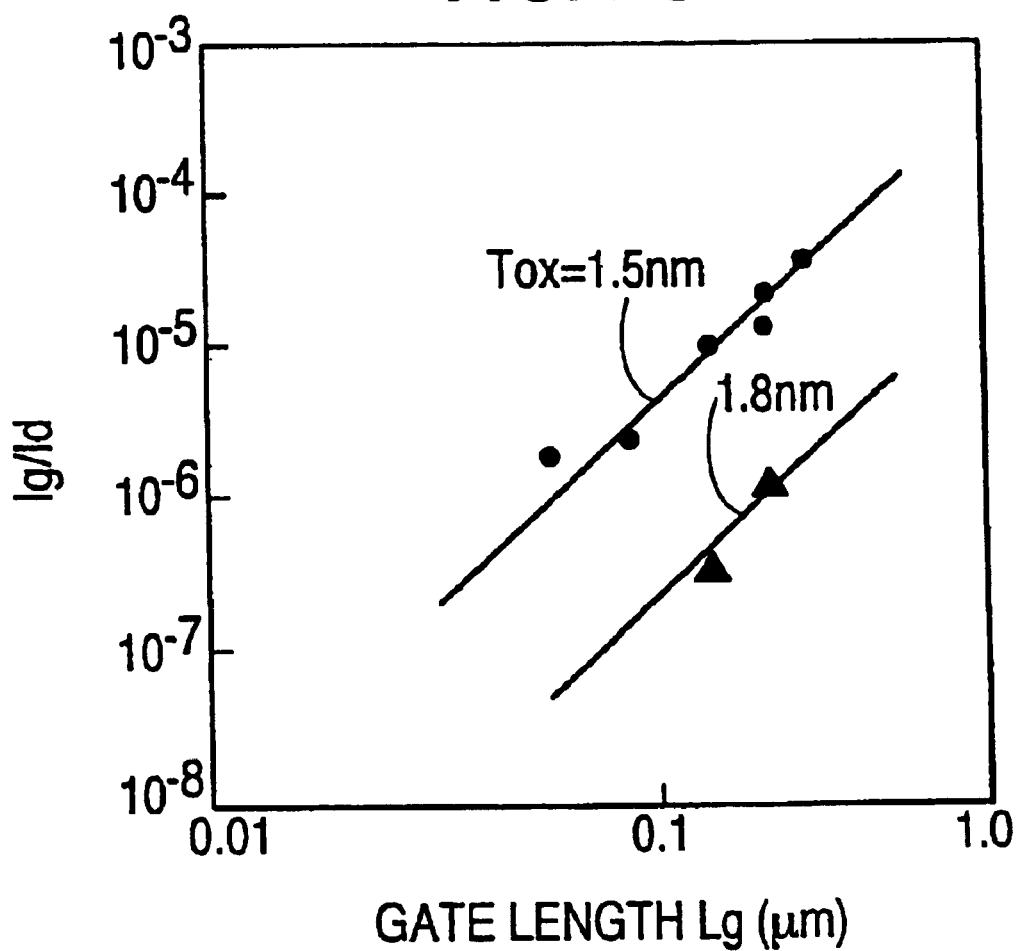
FIG. 23 is a graphical representation showing the gate current ratio $I_g/I_d$ to the drain current, according to the gate length $L_g$.

FIG. 23 shows how the ratio $I_g/I_d$ ($I_g$: tunneling current, $I_d$: channel current) changes according to the oxide film thickness $T_{OX}$ and the gate length $L_g$. FIG. 23 indicates that when the oxide film thickness $T_{OX}$ is 1.8 nm (about 20% thicker than $T_{OX}$=1.5 nm), the same the ratio $I_g/I_d$ can be obtained even if the gate length $L_g$ is lengthened twice larger than that obtained when the oxide film thickness $T_{OX}$ is 1.5 nm. Therefore, the same leakage current rate occurs when the gate length $L_g$ is shortened by half when the oxide film thickness $T_{OX}$ is 1.5 nm, as compared with when the oxide film thickness $T_{OX}$ is 1.8 nm.

As shown in FIG. 12, the ratio $I_g/I_d$ ($I_g$: tunneling current, $I_d$: channel current) increases abruptly from a value of about $6 \times 10^{-5}$ at a point $V_g$ of 1.5 V. Therefore, it is preferable to decide the gate length $L_g$ and the insulating film thickness $T_{OX}$ so that the ratio $I_g/I_d$ will not exceed this limit value ($6 \times 10^{-5}$). At this limit value of $6 \times 10^{-5}$, the following expression can be established $$T_{ox}(\text{nm}) = \log L_g(\mu\text{m}) + 2.02$$

Therefore, the allowable gate length $L_g$ (µm) at an insulating film thickness $T_{OX}$ (nm) is $$L_g \leq 10^{(T_{ox} - 2.02)}$$

When the LSI is applied to a one-million (1 M bits) memory by further reducing the gate current to increase the LSI integration rate, if the power consumption as one LSI is determined about 10 mA, the allowable gate current per transistor is $10^{-8}$ A/µm. In this case, with reference to FIG. 6 (in which the tunneling current $I_g$ shown for each 10 µm gate length $L_g$), the allowable gate length $L_g$ (for obtaining the allowable tunneling current $I_g$ $10^{-8}$ A/µm) is 0.15 µm (if $T_{OX}$ is 1.8 nm) and 0.30 µm (if $T_{OX}$ is 1.8 nm). That is, the following expression can be obtained:

$$T_{ox}(\text{nm}) = \log L_g(\mu\text{m}) + 2.32.$$

Therefore, if the allowable gate length $L_g$ (µm) in a film thickness is $$L_g \leq 10^{(T_{ox} - 2.32)}$$

it is possible to further improve the performance of the transistor and thereby to apply the transistors to a higher performance LSI.

Figure 27A:
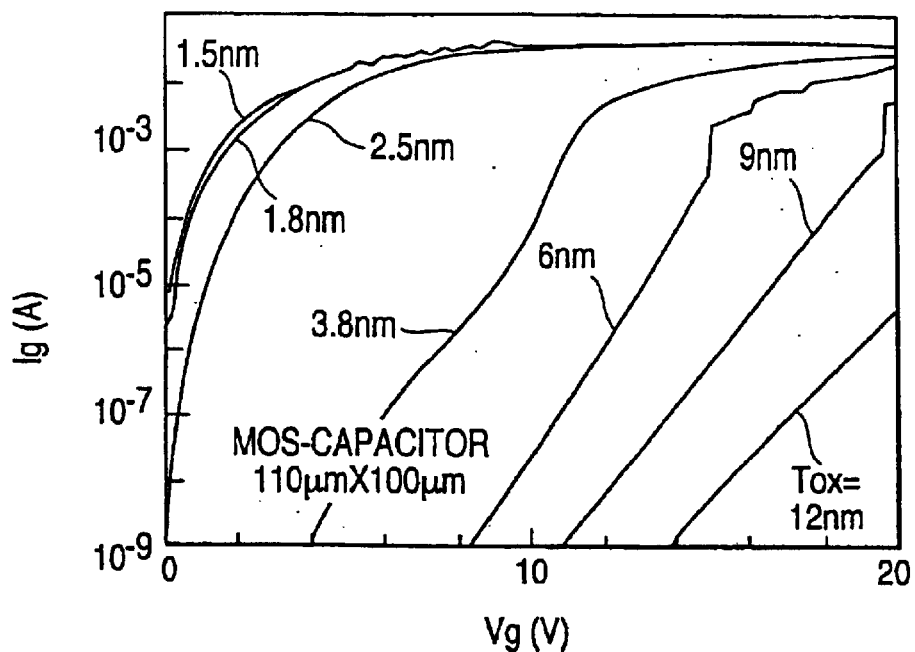
FIG. 27A is a graphical representation showing the ($I_g$–$V_g$) characteristics of the gate insulating films of various film thicknesses $T_{OX}$ used for the ordinary tunneling gate oxide film MOSFET, in which a number of sorts of the gate insulating films are shown.
Figure 27B:
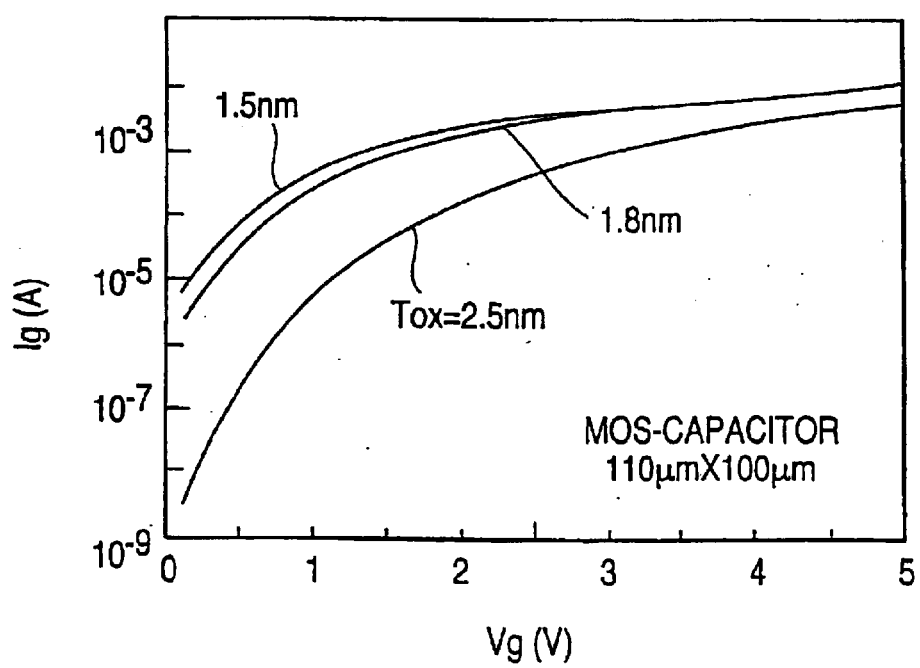
FIG. 27B is a more detailed graphical representation showing the ($I_g$–$V_g$) characteristics of the gate insulating films of various film thicknesses $t_{ox}$ used for the ordinary tunneling gate oxide film MOSFET, in which the film thicknesses are more limited.

FIGS. 27A and 27B show the ($I_g$-$V_g$) characteristics of the gate insulating films with various film thicknesses $T_{OX}$ used for the ordinary gate oxide film MOSFETs, in which the ordinate ($V_g$ axis) of FIG. 27B is elongated more than that of FIG. 27A. Therefore, FIG. 27A shows the same characteristics of the various gate insulating films more than those shown in FIG. 27B. Further, FIG. 27B shows the detailed characteristics of the gate insulating films by limiting the sorts of the films. In FIG. 27B, the characteristics can be obtained by measuring the MOS capacitances in relatively broad areas (110 µm×100 µm). When these characteristics of the insulating films are used for the MOSFET, as shown in FIG. 28, it is known that this leakage current decreases due to the down-sizing of the gate area.

Figure 29:
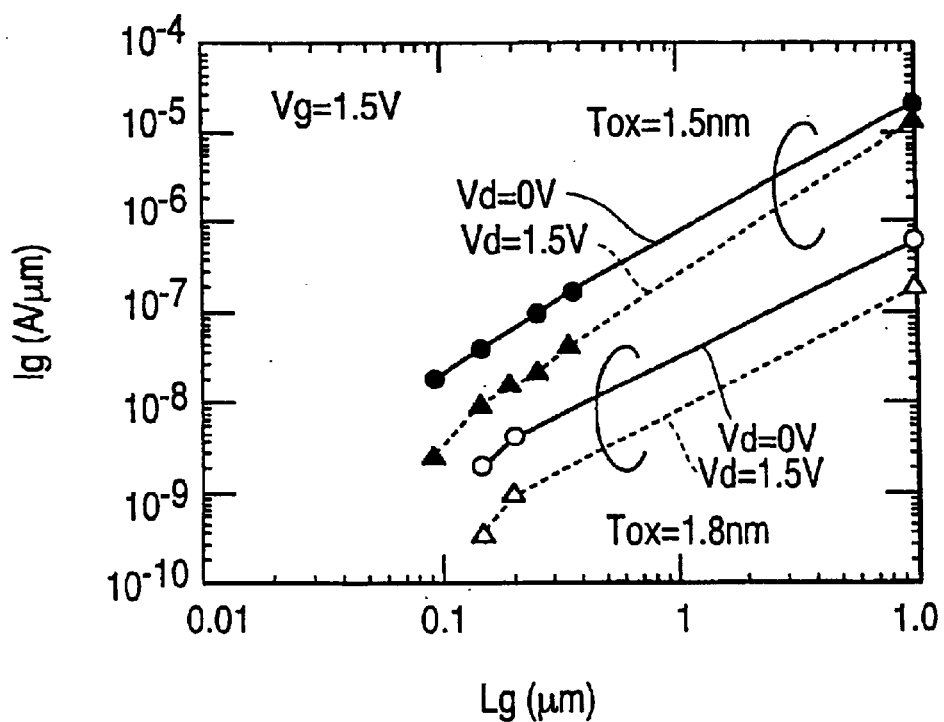
FIG. 29 is a graphical representation showing the relationship between the gate leakage current $I_g$ and the gate length $L_g$ obtained when the tunneling gate oxide film is applied to the MOSFET.

FIG. 29 shows the relationship between the gate leakage current $I_g$ and the gate length $L_g$ obtained then the tunneling gate oxide film is applied to the MOSFET. As shown in FIG. 29, although it is known that when the tunneling gate oxide film is used for the MOSFET, the leakage current $I_g$ decreases with decreasing gate length $L_g$. However, the dependance of the tunneling gate leakage current $I_g$ upon the gate length $L_g$ is larger than $1/L_g$. Accordingly, when the circuit is constructed by only the transistors of a short gate length, it is possible to suppress an increase of the power consumption due to the leakage current, as compared with the transistors of a long gate length.

Figure 30A:
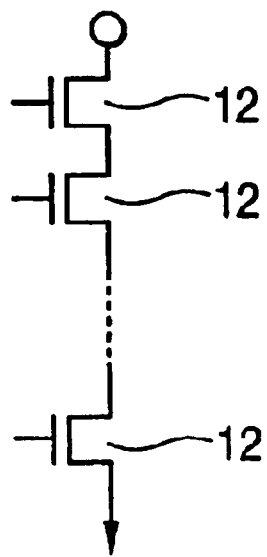
FIG. 30A is a circuit diagram showing the structures of the prior art MOSFET improved to reduce the gate leak current.
Figure 30B:
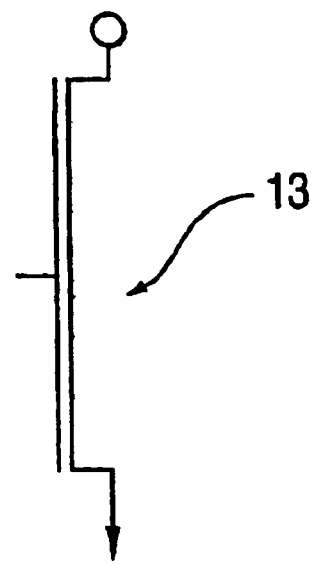
FIG. 30B is a circuit diagram showing the structure of the MOSFETs according to the present invention improved to reduce the gate leak current.
Figure 31:
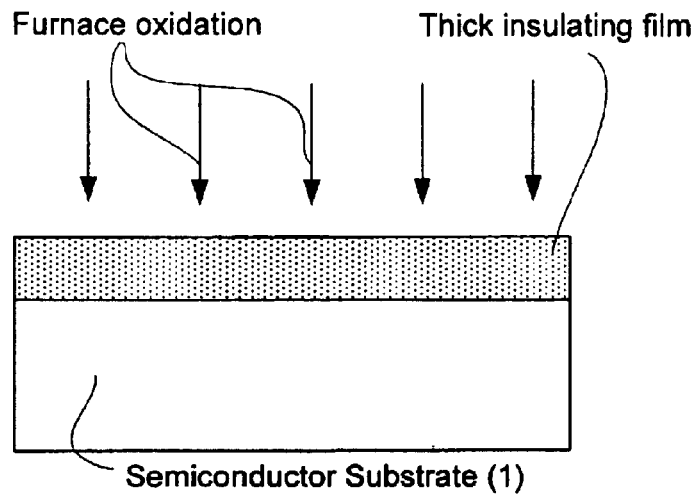
FIG. 31 schematically shows the formation of a thick insulating film using furnace oxidation.
Figure 32:
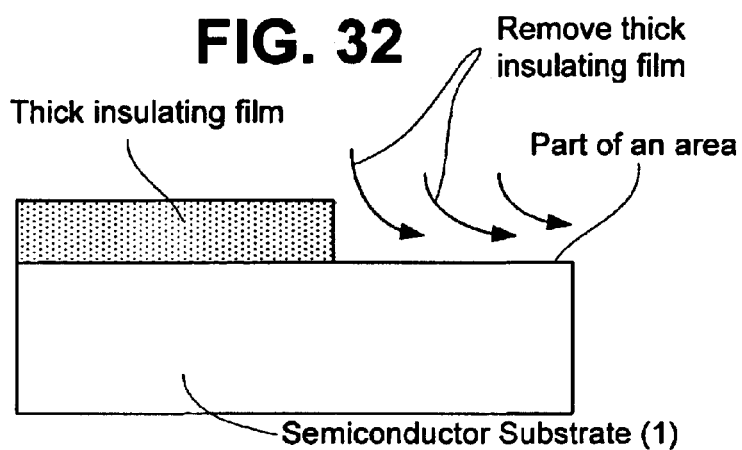
FIG. 32 schematically shows the removal of the thick insulating film formed on FIG. 31 from a part of an area of a silicon substrate.
Figure 33:
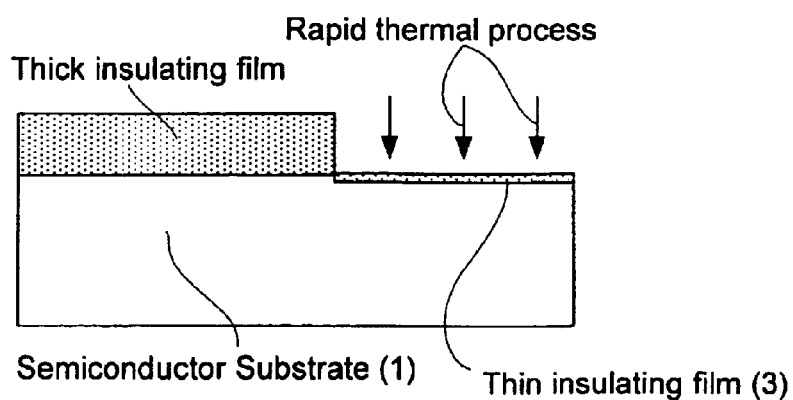
FIG. 33 schematically shows the formation of a thin insulating film using a rapid thermal process.
Figure 34:
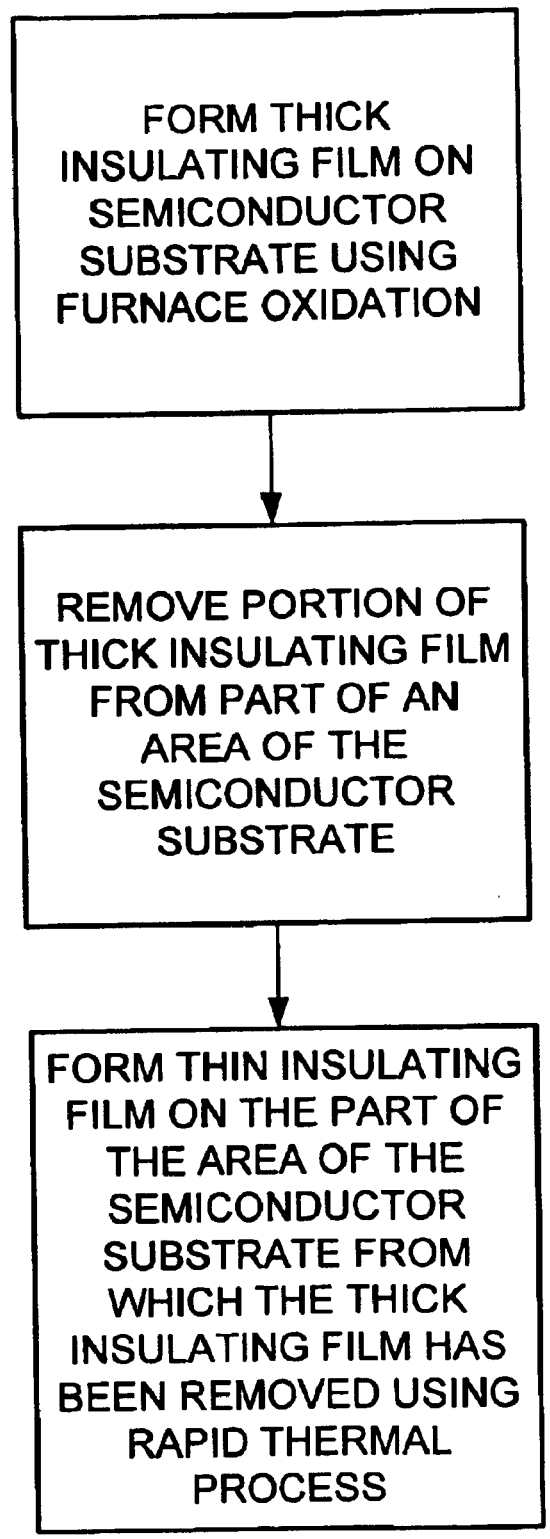
FIG. 34 is a flow chart depicting the steps which are carried out in FIGS. 31–33.

FIG. 30A shows MOSFETs 12 according to the present invention, and FIG. 30B shows a conventional MOSFET 13 in comparison with FIG. 30A. The MOSFETs 12 shown in FIG. 30A have a performance equivalent to that of the MOSFET 13 shown in FIG. 30B. However, when an appropriate number of the MOSFETS 12 of a short gate length are connected in series, it is possible to realize the circuit having a desired current drive capability, in spite of a small power consumption. In other words, by use of the transistors according to the present invention, it is possible to realize a semiconductor device which can suppress the leakage current sufficiently, that is, which is suitable for a low power consumption.

As described above, in semiconductor device according to the present invention, since the gate insulating film thickness $T_{OX}$ is determined less than 2.5 nm, it is possible to improve the reliability under hot carrier stress. In addition, since the gate length $L_g$ is determined equal to or less than 0.3 µm, it is possible to reduce the tunneling current $I_g$ flowing from the source/drain electrode to the gate electrode, so that the transistor characteristics can be improved. In addition, when used at a supply voltage of 1.5 V or lower, the reliability of the transistors can be further improved.

Further, in case an excessive surge voltage (e.g., noise exceeding the supply voltage) is applied to the MOSFET with Schottky diode, since the Schottky diode is broken down, it is possible to prevent the MOSFET from being broken down, so that it is possible to realize the transistor resistant against the electrostatic breakdown.

What is claimed is:

1. A method for manufacturing a semiconductor device comprising:

forming a MISFET having a first-conductivity type semiconductor substrate; an insulating film formed on said semiconductor substrate; a gate electrode formed on said semiconductor substrate via said insulating film; a second-conductivity type source/drain region formed on both sides of a channel forming region located under said gate electrode formed on said semiconductor substrate via said insulating film; a thickness of said insulating film being less than 2.5 nm at a silicon oxide equivalent thickness; and a gate length of said gate electrode being equal to or less than 0.3 µm, in a part of an area of said semiconductor substrate;

wherein said method comprises:
forming a thick insulating film on a surface of said semiconductor substrate by a furnace oxidation method;
removing the thick insulating film at said part of an area; and forming a thin insulating film of less than 2.5 nm at a silicon oxide equivalent thickness at said part of an area by a rapid thermal process.

2. The method for manufacturing a semiconductor device according to claim 1,
wherein said part of an area includes a corner of the semiconductor substrate.

3. The method for manufacturing a semiconductor device according to claim 1, wherein said part of an area includes an outer portion of the semiconductor substrate.

4. The method for manufacturing a semiconductor device according to claim 1,
wherein said thin insulating film is an oxide film and said oxide film is formed by a rapid thermal oxidation (RTO) method at said part of an area.

5. The method for manufacturing a semiconductor device according to claim 4,
wherein a channel direction length (Lg) of said gate electrode and a thickness (Tox) of said oxide film are determined by the following relationship;

$$Lg \leq 10^{(Tox-2.02)}$$

where a unit of Lg is $\mu$m.

6. The method for manufacturing a semiconductor device according to claim 5,
wherein the thickness (Tox) of said oxide film is less than 2.5 nm.

7. The method for manufacturing a semiconductor device according to claim 5,
wherein the thickness (Tox) of said oxide film is equal to or less than 2.0 nm.

8. The method for manufacturing a semiconductor device according to claim 4,
wherein a channel direction length (Lg) of said gate electrode and a thickness (Tox) of said oxide film are determined by the following relationship;

$$Lg \leq 10^{(Tox-2.32)}$$

where a unit of Lg is $\mu$m.

9. The method for manufacturing a semiconductor device according to claim 8,
wherein the thickness (Tox) of said oxide film is less than 2.5 nm.

10. The method for manufacturing a semiconductor device according to claim 8,
wherein the thickness (Tox) of said oxide film is equal to or less than 2.0 nm.

11. A method for manufacturing a semiconductor device comprising:
forming a MOSFET having a first-conductivity type semiconductor substrate; an oxide film formed on said semiconductor substrate; a gate electrode formed on said semiconductor substrate via said oxide film; a second-conductivity type source/drain region formed on both sides of a channel forming region located under said gate electrode formed on said semiconductor substrate via said oxide film; and a channel direction length (Lg) of said gate electrode and a thickness (Tox) of said oxide film are determined by the following relationship;

$$Lg \leq 10^{(Tox-2.02)}$$

where a unit of Lg is $\mu$m, in a part of an area of said semiconductor substrate;
wherein said method comprises:
forming a thick oxide film on a surface of said semiconductor substrate by a furnace oxidation method;
removing the thick oxide film at said part of an area; and
forming a thin oxide film of less than 2.5 nm at said part of an area by a rapid thermal oxidation (RTO) method.

12. The method for manufacturing a semiconductor device according to claim 11,
wherein said part of an area includes a corner of the semiconductor substrate.

13. The method for manufacturing a semiconductor device according to claim 11, wherein said part includes an outer portion of the semiconductor substrate.

14. The method for manufacturing a semiconductor device according to claim 11,
wherein the thickness (Tox) of said thin oxide film is equal to or less than 2.0 nm.

15. The method for manufacturing a semiconductor device according to claim 11,
wherein a channel direction length (Lg) of said gate electrode and a thickness (Tox) of said thin oxide film are determined by the following relationship;

$$Lg \leq 10^{(Tox-2.32)}$$

where a unit of Lg is $\mu$m.

16. The method for manufacturing a semiconductor device according to claim 15,
wherein the thickness (Tox) of said thin oxide film is equal to or less than 2.0 nm.

* * * * *